United States Patent [19]

Chung et al.

[11] Patent Number: 4,873,680
[45] Date of Patent: Oct. 10, 1989

[54] APPARATUS AND METHOD FOR DETECTING AND COMPENSATING FOR PIT EXTENSION IN AN OPTICAL DISK RECORDING SYSTEM

[75] Inventors: Chi H. Chung, San Jose; Theodore D. Rees, Mountain View; Ian Turner, Sunnyvale, all of Calif.

[73] Assignee: Laserdrive Ltd., Santa Clara, Calif.

[21] Appl. No.: 25,394

[22] Filed: Mar. 13, 1987

[51] Int. Cl.$^4$ ............................................. G11B 7/007
[52] U.S. Cl. ........................................ 369/59; 369/58; 369/54; 369/116
[58] Field of Search .................... 369/54, 58, 59, 106, 369/116, 121, 122, 124

[56] References Cited

U.S. PATENT DOCUMENTS

| | | |
|---|---|---|
| 3,689,899 | 9/1972 | Franaszek . |
| 3,995,264 | 11/1976 | Ouchi . |
| 4,313,188 | 1/1982 | Bartolini et al. . |
| 4,355,318 | 10/1982 | Miyauchi ............................... 369/54 |
| 4,488,277 | 12/1984 | McFarlane et al. ................... 369/58 |
| 4,523,304 | 6/1985 | Satoh et al. . |
| 4,549,288 | 10/1985 | Chan ..................................... 369/54 |
| 4,566,092 | 1/1986 | Gerard et al. . |
| 4,631,713 | 12/1986 | Romeas et al. ....................... 369/54 |
| 4,646,103 | 2/1987 | Sugiyama et al. .................... 369/44 |
| 4,648,085 | 3/1987 | Shimonou ............................. 369/54 |

Primary Examiner—Steven L. Stephan
Assistant Examiner—Kevin J. Fournier
Attorney, Agent, or Firm—McCubbrey, Bartels, Meyer & Ward

[57] ABSTRACT

A system for storing and retrieving encoded data on an optical recording medium using pit edge detection is disclosed. The pit extension characteristics of a given medium are determined by first using laser beam test write pulses to form one or more pits on the medium and then detecting the time durational difference between the pulse width of the test write pulses and the duration of the leading edge transitions to trailing edge transitions of the corresponding pits formed on said medium. This difference value may be stored in a certification sector of the medium. Subsequent write pulses are modified in duration in an amount equal to this detected durational difference. For forming a pit that is longer than a predetermined minimum length, the corresponding write pulse is made non-continuous in order to minimize cumulative pit extension. The number of non-continuous pulses used to form a given pit is a function of the desired length, the on time of each pulse and the duration of the off time between adjacent write pulses, said off time being a predetermined length to cause pit extension overlap between the portions of the pit formed during the one time of each said write pulse, thereby forming a continuous pit.

15 Claims, 14 Drawing Sheets

OEM CODE HOLE SIZES

OEM CODE HOLE SIZES

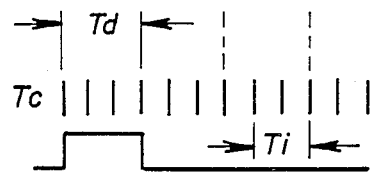
FIGURE 8
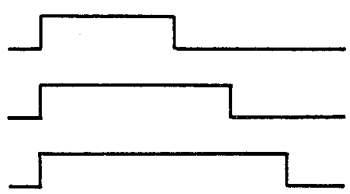
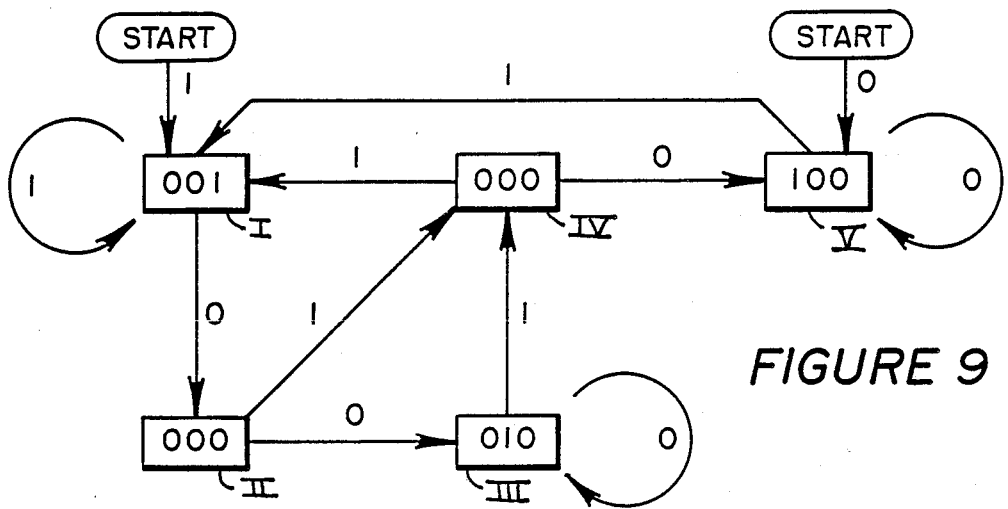
FIGURE 9
FIGURE 10
|  | NRZ | RZ |
|---|---|---|
| 0000 | STAY HIGH OR STAY LOW | LOW ONLY |
| 0010 | ⌐ OR ⌐ | ⌐⌐ |
| 0110 | ⌐⌐ OR ⌐⌐ | ⌐⌐ |
| 1010 | ⌐⌐ OR ⌐⌐ | ⌐⌐⌐⌐ |

APPARATUS AND METHOD FOR DETECTING AND COMPENSATING FOR PIT EXTENSION IN AN OPTICAL DISK RECORDING SYSTEM

BACKGROUND OF THE INVENTION

1. Field of Invention

This invention relates to the field of systems for the storage and retrieval of encoded data on an optical recording medium. More particularly, this invention relates to the detection of and compensation for the recording error of pit edge extension associated with the physical alteration of the recording surface of an optical disk during the writing of data using pulses of laser light energy.

2. Prior Art

The recording of encoded data on optical media for subsequent retrieval is well known in the art. Generally, modulated light energy, such as a laser beam, is directed onto a light absorbing surface of an optical recording medium. The light energy is converted to thermal energy which physically alters the light absorbing surface region or an interior layer or layers in the medium to form an area of different reflectivity or different geometry, e.g. a pit, which is detectable optically during read operations. One of several modulation codes known in the art may be used to encode data, to control the generation of laser write pulses, and to control detection and retrieval of stored encoded data from the optical medium.

One disadvantage inherent in the use of laser light energy to store encoded data on an optical medium is that pitting cannot be completely restricted to the area defined by the period of laser beam irradiation during writing. When a pulse of laser light irradiates the medium surface during writing for a selected time as the medium turns, the leading and trailing edges of the pit extend somewhat beyond the laser on time because the thermal propagation of the laser energy on the recording surface continues for a time beyond the selected laser on-time. This pit extension depends on the thermal characteristics of the particular optical disk being used. The severity of pit extension is increased as the length of the laser irradiation is increased, due to the accumulation of thermal effects, resulting in distortion of the encoded data when read. This also results in an increased pit edge transition jitter.

Because of the problem of non-uniform pit extension and excessive pit edge transition jitter, optical systems in the prior art have read encoded data by detecting the presence or absence of a pit using the transition at the center of the pit, referred to as pulse position modulation (PPM), within selected clock time periods. A drawback of PPM is that it limits the maximum density of data that can be written to and read from the medium. That is, only one transition can be detected for each pit, whereas with pit edge transition detection, referred to as pulse width modulation, each pit has two transitions that represent data. Although pit center detection systems are capable of detecting pit edge transitions, according to the prior art, doing so would result in a high error rate due to the variation in spacing between edges caused by variation in pit edge extension and the resultant increased itter in the positioning of the pit edge transitions. Consequently, even though a pit edge transition detection scheme would have the great advantage of effectively doubling the data storage capacity of a medium, this technique is not generally used in the prior art. No known scheme is currently known in the art where pit edge detection is used in a write once optical recording system.

The only prior art optical storage systems wherein pit edge modulation is used is in CD-audio and CD-ROM optical recording systems. A typical storage capacity of greater than 550 megabytes on a 120 millimeter diameter CD-ROM disk is readily achievable due to the use of pit edge modulation and EFM coding. The success of this coding is enabled because of the ability to form high quality long pits with low edge itter on the medium. This is possible because the pits on a CD-ROM disk are generated on a photo-resist coated optical quality glass disk by a high precision and high power laser recording system under carefully controlled conditions. Such processing conditions are not duplicatable on conventional write-once or erasable optical recording systems.

Because the degree of pit extension is peculiar to each individual recording medium, another obstacle to the efficient use of a pit edge transition detection scheme is that a system designed to compensate for the pit extension characteristics of one medium must also be designed to compensate for the differing pit extension characteristics of any other medium to be used if interchangeability is to be achieved. Nothing in the prior art suggests how to achieve the advantages of a pit edge transition detection scheme without unacceptable error rates while also achieving media interchangeability.

SUMMARY OF THE INVENTION

It is therefore an object of the present invention to provide an improved apparatus and method for storing and retrieving encoded data in an optical recording system.

It is another object of the present invention to provide means for increasing data recording density, for increasing accuracy and reliability of data storage and retrieval, and for insuring media interchangeability in an optical recording system.

It is a more specific object of the present invention to provide an apparatus and method for generating multiple non-continuous laser write pulses to create one or more pits or the like of varying length in a medium, wherein the pit edges are controlled so as to minimize variations in pit extension created by pits of different length and to reduce pit edge transition jitter.

It is a further object of the present invention to provide means for detecting and compensating for pit edge extension during writing of data on a medium.

To achieve these and other objects and advantages, the present invention provides a method and apparatus for storage and retrieval of encoded data on an optical recording medium using detection of pit edge transitions. The present invention enables the formation of pits of more than one laser diameter in length by providing means for generating sequential laser on and off periods or times. The pits thus formed are overlapping aggregates of one or more smaller regions of changed reflectivity wherein each such smaller region is created by a separate laser on time, thereby making pit extension uniform among pits, regardless of pit length. Furthermore, this reduces the pit edge transition jitter regardless of pit length. An increase in data density of a factor of two and a substantial reduction of the error rate is thus achieved in optical storage systems according to the present invention.

To accomplish the above, the present invention includes means for testing each medium for its particular thermal characteristics so as to determine the degree of pit extension resulting from the pitting of that specific medium by write pulses of one or more predetermined values of laser light energy. The means for determining the degree of pit extension for a specific medium includes means for controlling the duration of the on time and the duration of the off time of a series of test write pulses such that each said pit on said optical recording medium formed thereby includes the width of one more corresponding said write pulses of laser light energy and the width of said pit extension, and comparator means for detecting the durational difference between each said test pulse or series of adjacent test pulses, and the duration of the corresponding pit formed on the optical recording medium.

The results of such testing provide means for compensating, in data write operations, for pit extension for the given medium on which data is being written, so that deviation in the duration of a given pit from a desired length, i.e. the time between its leading edge and its trailing edge, is minimized. In the preferred embodiment, a minimum pit length is formed using a continuous laser pulse whose on time is a function of the pit extension characteristics of the medium being recorded on, while longer pits are formed by a plurality of non-continuous minimum pit length laser write pulses, the number of such laser write pulses depending on the length of the desired resultant pit, wherein the duration of the on period of each write pulse and the duration of the write pulse off time, the period between adjacent write pulses, is controlled as a function of said detected pit extension. The resultant pits each include regions formed by said write pulse and by said pit extension. The regions between adjacent write pulses in longer pits is formed by the overlapping pit extension resulting from said write pulses.

Because the testing and compensating means of the present invention can be applied to any medium usable in the optical recording system, media interchangeability is also achieved. Non-continuous pulsing of the laser beam during writing also increases the life of the laser.

BRIEF DESCRIPTION OF THE DRAWINGS

FIG. 8 illustrates the timing of an exemplary optical edge modulation (OEM) code.

FIG. 9 illustrates the state diagram for the OEM code shown in FIG. 8 as a function of input data bits, illustrating the five code word states generated by said code.

FIG. 10 illustrates examples of signals in non-return to zero (NRZ) format as compared with signals in return to zero (RZ) format.

DETAILED DESCRIPTION OF THE PREFERRED EMBODIMENT

When a pulse of laser light energy is applied to an energy absorbing recording surface or area of an optical medium, the light energy is transformed into thermal energy, causing the generation of a region of changed reflectivity on the recording surface. This reflectivity change may be the result of an ablation on the surface of the medium, or the result of other physical effects known in the art.

Figure 1:
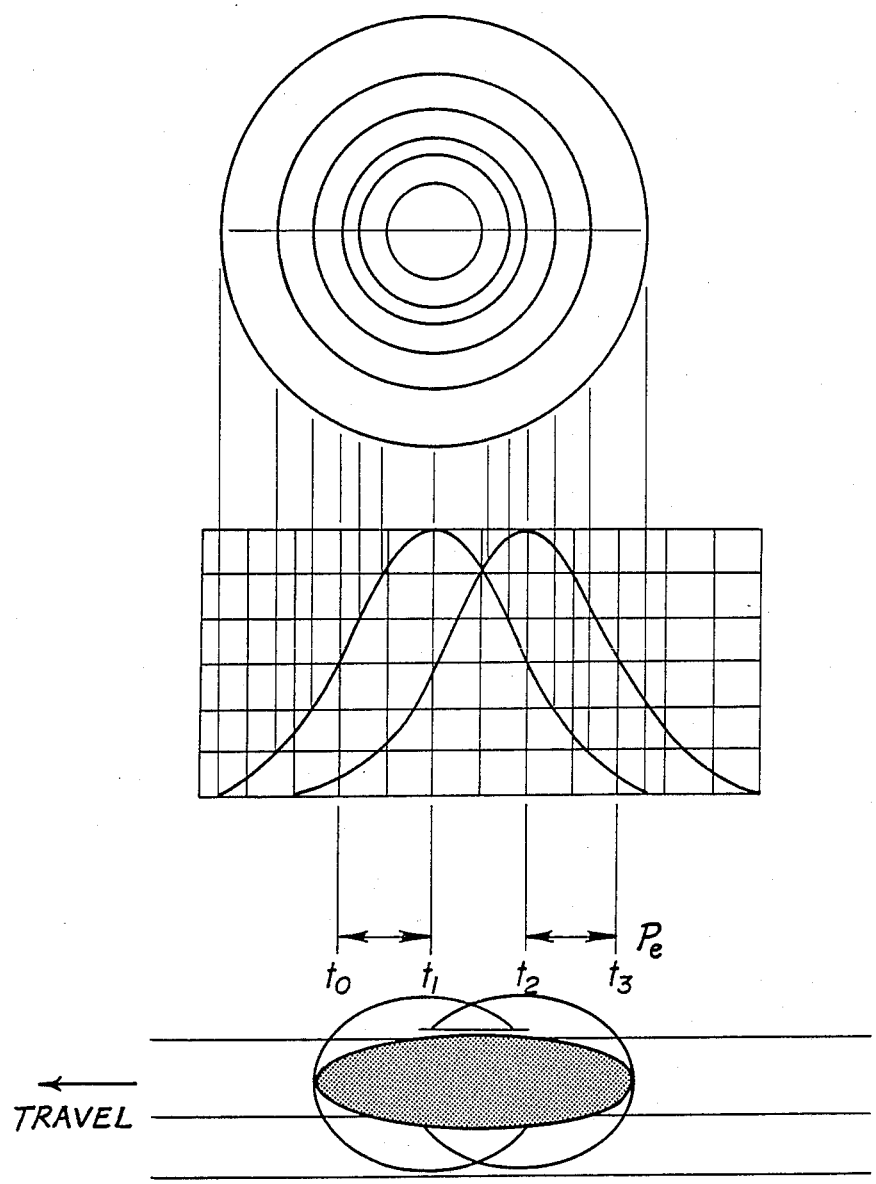
FIG. 1 illustrates an exemplary laser beam energy profile and resultant typical pit or hole of altered reflectivity formed in the surface of an optical medium moving. with respect to said laser beam for a single pulse of laser light energy.

In conventional optical storage systems, when data is to be written and stored on an optical medium, the laser beam is focused on the medium into a spot whose diameter is about one micron, measured at the half power point of the intensity distribution (FWHM). The spot intensity distribution is approximately gaussian, i.e., it is very hot at its center and relatively cold at its edges. Such an intensity distribution for laser light energy is shown in FIG. 1. This spot of light has sufficient energy that it forms a pit, or in some other way modifies the reflectivity of the medium. The resultant size of the pit depends upon a number of factors such as: laser power, laser on time, the media pit formation mechanism, and media surface topology. An exemplary pit formation mechanism would be where the medium is moving with respect to the laser. In such a case, the size of the pit is also a function of the speed of this movement.

To form a pit, the surface of the medium must be brought up to some temperature. Because the spot intensity profile distribution is not uniform, and because the heat applied conducts away from the point of application, the heat on the surface of the medium is not uniform. The size and shape of the pit depends upon the heat profile of the medium.

Note that various types of media are available, including media where the region of the medium susceptible to alteration in reflectivity is not on the surface but at an interior layer. Similarly, the region of changed reflectivity after laser beam exposure may not be a physical deformation in the surface, but may simply be a change in the characteristic of a material.

In any encoding scheme, there must be one pit size that is a minimum size. The starting point in understanding this minimum pit process is to specify that the medium is stationary. The variables in this case are the power and on time of the laser pulse. If the power level is too low, the media will never get warm enough to form a pit. If the power level is high enough, the pit size will depend only upon the amount of energy applied when the laser is pulsed. In the typical case, the size of the pit formed will depend upon both the power level and the on time. If too much energy is applied, the pit will not be the same from one pit to the next. A typical laser is capable of operating at a level where the heat dissipation during the laser on time is small. Note that even during the laser off time, the time during which the laser is not at a sufficient energy output to cause writing on the optical medium, the laser may still be outputting light energy. In a preferred embodiment, during so-called laser off times, the laser is still generating light energy at a level sufficient to enable read back of data stored on the optical disk.

Since the medium must be moving with respect to the laser when the laser is pulsed on, another question is how much motion should occur for a minimum pit size. If the distance that the beam moves relative to the medium is small compared to the beam size, it is implied that the medium is moving slower than it could. Thus, the data rate would be lower than that possible. If the distance that the medium moves relative to the beam is large compared to the beam size, the heat is necessarily spread out, forming a lower temperature and a more diffuse thermal pattern on the media. Thus, pits formed in this way will be unstable, due to the lack of sharp thermal definition and inadequate heating. Therefore, an optimal amount of medium travel during a given laser pulse on-time is implied by the dual constraints of data rate, and laser power. This optimal amount of medium travel is approximately equal to one half of a beam diameter measured at the half power profile. FIG. 1 illustrates a beam profile and a resultant typical hole or pit for a single pulse of laser light energy having the indicated energy profile.

As seen in FIG. 1, with a laser on time occurring between time t1 and t2, a pit is generated whose length extends from t0 to t3. This is the result of pit extension occurring on each side of the portion of the medium on which the peak intensity of the laser light energy is focused. As seen, the pit extension results from a combination of the distribution in intensity of the laser beam on the surface of the medium along with remanant thermal effects while the medium cools down, such that alteration of the medium extends to the FWHM profile point of said laser beam.

In other words, the effect of the heating of the medium does not cease instantaneously as the surface of the medium rotates beyond the region being irradiated by the beam, nor does it cease when the laser pulse ends. The recording surface of the medium retains some heat during a cool down period. This retained heat causes extension of the periphery of the pit. Of greatest concern is the pit extension in the medium generated at the leading and trailing edges of the pit along the medium's direction of travel with respect to the laser beam. Note that the total pit duration is therefore greater than the on-time of the laser by an amount equal to Pe, the pit extension.

The power and speed requirements of the system can be derived from the minimum pit size process described above. When longer pits are desired, if one simply kept the laser on for a longer time, a significant problem results. The leading edge of the pit will be generally unaffected since the beam is moving away from it. However, the trailing edge of the pit will not only be extended from the trailing edge of the minimum pit by the added on time, it will also be affected by the accumulation of thermal energy in the medium. This presents a problem in the read/write process because the various lengths of pits are no longer simply related to the length of the on pulse.

Pit extension is undesirable because it results in errors during read operations due to undesirable and uncontrolled variations in the time of occurrence of pit edge transitions. Pit extension, for a particular medium, is unique because it is determined by the unique thermal characteristics of that medium. To reduce such errors, the pit extension effect must be controlled and compensated for. The present invention compensates for pit extension by providing means for automatically determining the extent of pit extension generated by a given medium being tested and for storing on the medium this pit extension value for reference during later recording operations. In other words, the thermal response of the medium to the application of test write pulses of laser light energy is measured and later used, according to the present invention, for adjusting the periodicity and duration of laser on time and the resultant length of each pit, so as to maximize density on the medium and to reduce error caused by pit extension. This stored pit extension value can also be compared with pit extension values subsequently obtained to enable monitoring of the medium's ongoing quality.

A second solution to the pit extension problem according to the present invention is to alternately pulse the laser on and off periodically during the formation of pits whose length exceed a minimum pit size, thereby controlling the extent of heating of the medium, and thus the degree of pit extension, independent of pit length. That is, a minimum pit is first created by a laser on time pulse. It is followed by a laser off time cooling off period. A second segment length of the pit is formed by a second pulse whose trailing edge forms the pit trailing edge. The laser off time between these two write pulses is set so that overlapping pit extension from each pulse generates the portions of the pit needed to fill in between these two pulses. Pits of other longer lengths are formed by generating further pulses whose cooling off times between each pulse are sufficient for pit extension joining of adjacent pit portions.

Figure 2:
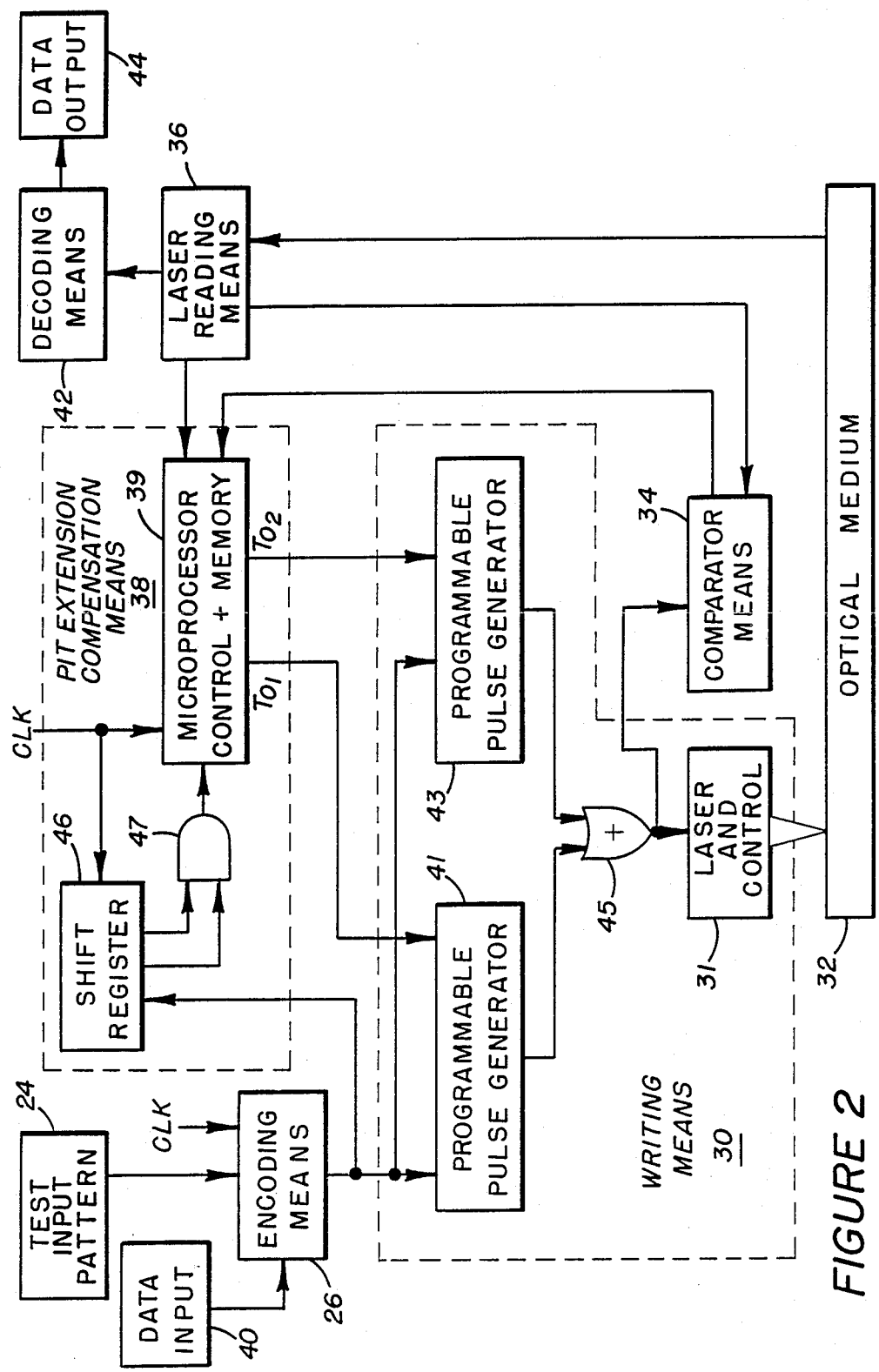
FIG. 2 is a block diagram showing a preferred embodiment of an apparatus of the present invention.

The preferred embodiment of the present invention is shown in FIG. 2. The method of the present invention can be described in reference to the apparatus of FIG. 2.

The initial testing or certification of an optical recording medium according to the present invention begins with the selection of a test input pattern 24 of test data to be recorded. Preferably, the selected test data is such that laser write pulses of various durations will ultimately be generated. It is particularly important that the test pattern generate pits corresponding to the maximum and minimum pit lengths that are to be generated with the modulation code being used to encode data for recording. To minimize cumulative pit extension when larger test pits are formed, it is also preferred that such larger pits be generated by two or more laser write pulses, the number of such pulses being a function of the pit length desired, wherein each pulse is separated by a laser off time reflective of expected pit extension.

The test input pattern 24 is encoded by encoding means 26 using a selected laser pulse modulation code known in the art. The output of encoding means 26 is fed to a write means 30 which includes a conventional laser and controller 31 which generates pulses of laser light energy of a duration determined by the test code bits generated by encoding means 26 and by the minimum length of laser on time To. The minimum length of the laser on pulses is set so as to generate the minimum pit length formable on the medium, assuming for purposes of certification that the medium will not generate any pit extension. The laser pulses are applied to one or more test certification segments or sectors on the recording surface of the optical recording medium 32 being certified. Pits are formed as described above in reference to FIG. 1 and are representative of said test code bits. The laser pulse on-time is stored in a comparator means 34.

The medium certification procedure continues as a conventional reading means 36 reads the pits formed on the certification sector of medium 32. This is accomplished by the detection of the reflectivity of each portion of the recording surface of the medium 32 as it is scanned by reading means 36. In the present invention, the leading and trailing edges of each pit are detected. The signal generated in reading means 36 due to this change of reflectivity between non-pitted and pitted portions of the test track segments of medium 32 is also coupled to comparator 34. This signal represents the total pit duration of each detected pit. Comparator means 34 then compares the stored value of the laser pulse on time used to form each detected pit with the detected actual duration of the pits existing in the certification sector. Comparator means 34 functions to determine the durational difference between these two values which represents the pit extension generated by that laser on time. These pit extension values are then averaged by a pit extension compensation means 38. Pit extension compensation means 38 preferably includes a microprocessor control and memory, as shown at 39, for performing the certification and pit extension compensation functions described below with reference to FIGS. 3-6. It is deemed to be within the ordinary skill in the art to design such a microprocessor 39 to implement the function of steps described in these figures. Once the pit extension value is obtained, a compensated laser on time may then be calculated by said compensation means 38 and is equal to the duration of said minimum pit length less the pit extension value. As described in greater detail below, the pit extension value is then caused to be stored by said pit extension compensation means 38 in the certification sector of medium 32 so as to be available for later use. The new value of laser on time, compensated for pit extension of the medium, may also be stored for later use. It may also be useful for said pit extension compensation means to measure and store different pit extension values, a first generated by a first pit length and one or more others generated by other pit lengths. Different optimum laser on times would then be calculated based on these different pit extension values.

Typically, the certification of a medium is done by a medium manufacturer or vendor or a drive manufacturer. The apparatus and the certification procedure of this invention, therefore, also provide means for compensating for pit extension in the recording of subsequent data input by an end user. Note that the certification and recertification procedures described herein can also be used for media quality control; i.e. be used to reject media that do not meet minimum standards.

Any medium which has been certified in the manner described above may be used in an apparatus according to the present invention. This complete interchangeability of media usable in pit edge transition optical data storage was not possible according to the prior art because pit extension varies from medium to medium according to the unique thermal characteristics of each medium, and no prior art system enables these characteristics to be available to an end user for each medium used by the end user for data riding. Even if a recording apparatus in the prior art possibly could be adjusted to compensate for the known thermal characteristics of a particular medium, no means have been taught for enabling automatic readjustment of the apparatus when a different medium is used. Conversely, no means have been taught for enabling a particular medium, even if it could be used in a given apparatus, to include means for retaining pit extension values so as to enable such values to be used in another apparatus.

The data write operation of the present invention can also be described by reference to FIG. 2. The test value or values of pit extension for a given medium 32, as recorded on the certification sector of medium 32, are read by reading means 36, which couples these values into pit extension compensation means 38. Pit extension compensation means 38 also reads the certification sector of the medium and in conjunction with comparator means 34 determines new values of pit extension for different length pits. The previously recorded pit extension value or values, as read from the medium, are then compared by the pit extension compensation means 38 with the new values of pit extension. If they are within a predetermined range, the new pit extension value is used to set the on time of the laser for subsequent data writing. If the new pit extension value is different at least a predetermined minimum amount from the originally stored pit extension value, other certification sectors are read, if any exist on the medium. If none exist, the user system will proceed to recertify the medium in the manner described above as used by the medium manufacturer or disc drive manufacturer. Alternatively, the user can duplicate the data on the disk onto a second disk, after which the original disk is disposed of. If a recertification is attempted, a more accurate value of pit extension reflective of the current quality of the optical disk is obtained. This new pit extension value is recorded on a new certification track or sector of the medium and a new value of laser on time calculated. The medium is then ready for use for data recording.

In operation, therefore, pit extension compensation means 38 uses these one or more pit extension values to adjust the duration of the laser data write pulses generated by writing means 30. Data input at 40 is encoded by encoding means 26, the output of which is coupled to writing means 30 to cause generation of one or more laser pulses as determined by the encoded signal. The duration of the laser pulses generated by the encoded signal from encoding means 26 is reduced by the pit extension value retained by pit extension compensation means 38. Note, as mentioned above, more than one value of pit extension could be calculated for different pit lengths.

More specifically, the microprocessor control and memory 39 will output a signal representative of said compensated laser on time To and will feed this signal to a programmable pulse generator 41 in the writing means 30. The code bits from encoding means 26 are also coupled to the programmable pulse generator 41. The programmable pulse generator 41 is preferably a one shot which generates an output pulse whose pulse width is a function of the input To signal and which fires each time a code bit is generated by said encoding means 26, i.e., the encoding means 26 output acts as a clock to initiate each one shot pulse. Proper timing of the generation of code bits and the laser on time control pulse To is performed as a function of a conventional clock pulse CLK.

If more than one value of pit extension has been calculated and stored in the microprocessor control and memory 39, a plurality of additional programmable pulse generators, with an exemplary one of said generators shown at 43, can be added to the write means 30. Where two pit extension values have been determined, for example, resulting in the calculation of two pulse on-time time intervals To1 and To2, each of these signals are generated by the microprocessor control and memory 39 and coupled to one of said programmable pulse generators 41 or 43, respectively. Only one of said laser on time pulses To1 and To2 is generated at any give time, thereby enabling only one of said programmable pulse generators 41, 43 to output a pulse at said time, for causing the laser and control 31 to output laser light energy. A conventional OR gate 45 is used to provide the ORing of these two pulse generator 41, 43 output pulses.

It is anticipated in a prefered embodiment that multiple pit extension compensation may be desirable wherein a first pit extension value is used for compensating for minimum length pits and a second pit extension value is used when non-continuous laser write pulses are used to form longer length pits.

A simple detection scheme can be used by the microprocessor control and memory 39 to determine when pulses indicative of one or the other type of pit length is being output by said encoding means 26. Specifically, a shift register 46 may be used along with an AND gate 47 for detecting when the code bit output of the encoding means 26 indicates that a pit length longer than a minimum pit length is to be formed on the medium 32. In such a case, adjacent one pulses, according to a preferred modulation code, described infra, are output sequentially by encoding means 26. This signal, in addition to being coupled to the programming pulse generators 41 and 43, is also coupled to shift register 46. AND gate 47 detects when these adjacent one pulses have been clocked into shift register 46. The output of AND gate 47 is coupled to the microprocessor control and memory 39 to indicate that such a longer pulse is to be formed. In response thereto, the microprocessor control and memory 39 acts to output a To2 signal rather than a To1 signal, thereby causing programmable pulse generator 43 to be enabled and to output a laser on time pulse compensated by the second extension value. The laser and control 31 of writing means 30 responds to such laser on time pulses and writes the pit extension compensated encoded data pulses to optical recording medium 32.

When the data is subsequently read back, the former errors in pit edge transition position caused by pit extension will have been substantially reduced or eliminated, so that decoding means 42 will present the user with data at output 44 that accurately and reliably represents the data that had been input at 40.

Figure 3:
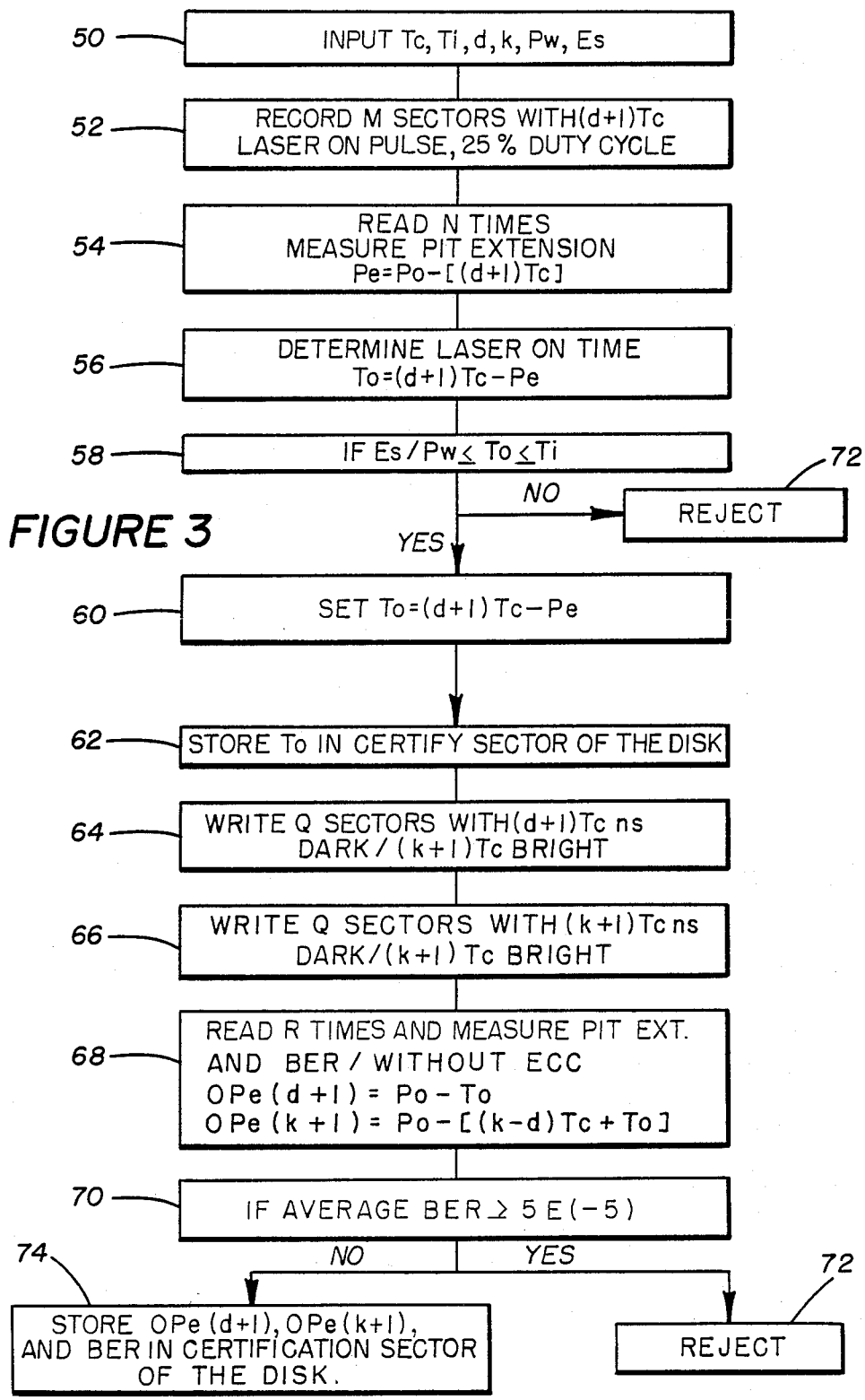
FIG. 3 is flow chart showing the preferred steps to be undertaken by a drive or media manufacturer in optical medium certification, for determining pit extension on a given medium according to the present invention.
Figure 7A:
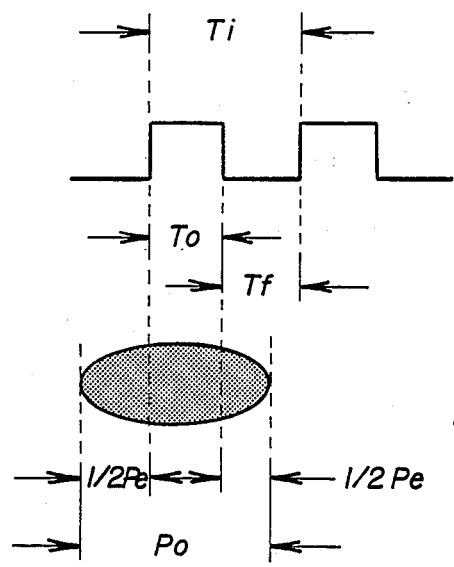
FIG. 7A is a diagram showing the fundamental code bit period of an exemplary optical edge modulation code and a typical pit formed on an optical recording medium resulting from a laser pulse generated according to such a code.

A more detailed diagram of the medium certification procedure according to a preferred embodiment of the present invention is shown in FIG. 3. The diagram assumes use of a binary coding scheme. The procedure determines the pit extension Pe for minimum pit size and for maximum pit size. This pit extension value is then used to determine the required laser on time To for a selected window time Ti. The relationship between the selected window time, the laser on time and the laser off time is shown in FIG. 7A. An exemplary resultant pit is also shown. The procedure of FIG. 3 also facilitates rejection or acceptance of a recording medium based on laser power availability and the measured average bit error rate (BER).

The input parameters required in this procedure are shown at Step 50, and include: the code unit time (Tc), which is determined by the medium data density desired by the user, the modulation code used, and the speed of rotation of the disk medium; the modulation code window time (Ti), which is defined as the sum of the single laser pulse on time (To) and the single laser pulse off time (Tf) and which is also equal to the minimum time increment between adjacent time intervals in the code; the minimum number of sequential binary codes zeros (d) permitted by the modulation code being used; the maximum number of sequential binary code zeros (k) permitted by the modulation code being used; the recommended write power (Pw) for forming a pit on the medium being used; and the saturation energy (Es) required to form a pit of shortest duration Td permitted by the modulation code being used. Es is a function of medium sensitivity and can be determined experimentally. Note that the smallest pit time Td for a specific modulation code is equal to $(d+1)Tc$ and that if Td is less than the FWHM of the laser divided by the speed of rotation of the medium, unreliable pits will be formed.

The To time is determined by the equation $To=(d+1)Tc-Pe$, once the pit extension is determined by the method described previously. This equation can be readily derived by equating the actual pit leading edge to trailing edge timing Po with the desired pit edge transition timings defined in the modulation code. For example, the desired pit timing, following the standard code nomenclature, can be $(d+1)Tc$, $(d+1)Tc+Ti$, $(d+1)Tc+2Ti$, . . . , and $(d+1)Tc+[(k-d)/(Ti/Tc)-jTi$. These desired pit timings are recorded using laser input pulses whose duration are defined by the parameters at step 50. More specifically, these pulses will be lTi(i.e., To+Tf), 2Ti(i.e., To+Tf+To+Tf), 3Ti(i.e. To+Tf+To+Tf+To+Tf), . . . , and $[1+(k-d)/(Ti/Tc)]Ti$ (i.e., a repeat of $To+Tf$ for $1+(k-d)/(Ti/Tc)$ times), where, as described above, Ti is defined as the minimum time increment between adjacent time intervals in the code. In other words, these pulses are a multiplication of the integer number of the code bit unit time. Consequently, the timing of write pulses can be easily synthesized from the code bit transitions, regardless of the modulation code selected, once To is determined. However, since there is a pit extension Pe resulting from thermal diffusion in each case, the actual pit timings will be equal to $To+Pe$, $Ti+To+Pe$, $2Ti+To+Pe$, ..., $[(k-d)/(Ti/Tc)]Ti+To+Pe$. By equating the actual pit timing and desired pit timing, one obtains:

$$(Ti+To+Pe)/(To+Pe)=[(d+1)Tc+Tij/(d+1)Tc$$

Solving for To results in the following equation:

$$To=(d+1)Tc-Pe$$

This is the fundamental equation that is used to compensate the laser on time To as a function of medium pit extension.

Having determined the above described input parameters, the certification routine proceeds as follows: First, one or more sectors M on the selected medium are pitted with pits using laser pulses having the duration $(d+1)-Tc$, as indicated in Step 52. A 25% duty cycle pattern is used to ensure that there is no overlap of the FWHM portions of adjacent laser pulses. Next, the sectors thus pitted are read back one or more selected times N, in Step 54, to determine the actual duration Po of the pits that were recorded on the medium. Pit extension (Pe) is calculated in Step 54 according to the equation $Pe=Po-(d+1)Tc$ where Po represents the actual pi duration detected on the medium. See also FIG. 7A.

From the measurement of pit extension in Step 54, a calculation is made in Step 56 of the laser pulse on-time (To) required to form a pit whose size, including pit extension, will correspond to the smallest pit allowed by the particular modulation code use. The above derived equation of $To=(d+1)Tc-Pe$ is used at this point. The value (To) is then compared in Step 58 to the ratio of saturation energy (Es) to recommended write power (Pw). Under certain conditions, it is possible than To will be larger that Ti or be smaller than the minimum time required to form a saturated pit on the medium at the selected medium rotation speed. The first case occurs when the smallest pit size $(d+1)Tc$ is twice the FWHM value of the laser pulse, or the pit extension detected is very small or even a negative value due to media thermal efficiency. The second case occurs when there is a limit on the available laser power in the optical head. In either case, according to the present invention, the medium is to be rejected, as shown at 72. That is, if To is greater than or equal to the ratio Es/Pw and is less than Ti, the medium is not rejected.

In Step 60 the compensated laser pulse on time (To) for a desired pit duration $(d+1)Tc$ is set at the value determined by the equation $To=(d+1)Tc-Pe$ for writing of data on the medium. That is, a laser pulse of the duration To will burn a pit of duration Po including pit extension. In Step 62, the value calculated for To is then stored in a selected certification sector on the medium.

Once To is defined, the next step is to use this To value of laser on time to record one or more sectors of test pit patterns. In Step 64, one or more sectors Q are written with a pattern of pits of minimum pit duration $[(d+1)Tc]$ permitted by the selected modulation code, separated by unpitted areas of maximum permitted duration $[(k+1)Tc]$. In Step 66, the pattern is reversed, with one or more sectors Q written with pits of the maximum pit duration $[(k+1)Tc]$ permitted by the selected modulation code separated by unpitted areas of minimum permitted duration $[(d+1)Tc]$.

In Step 68, the test sectors thus written are read and pit extension for each pit is calculated. For pits of minimum duration, the pit extension equation is $OPe(d+1)=Po-To$ where OPe designates original pit extension as distinguished from the pit extension values that may be calculated later by a user recertification procedure. For pits of maximum duration, the pit extension equation is $OPe(k+1)=Po-[(k-d)Tc+To]$.

Step 68 also includes calculation of the bit error rate (BER) in the test sectors. If the average BER is greater than a predetermined value, for example $5 \times 10^{-5}$ (Step 70) the medium is rejected (Step 72). Note that this predetermined value is arbitrary and depends on the medium's sensitivity, device operation variables, etc. If the BER is less than this specified value of $5 \times 10^{-5}$, the values $OPe(d+1)$ and $OPe(k+1)$ and the BER calculated in Step 68 are recorded in the certification sector, Step 74, thereby completing the medium manufacturer precertification procedure shown in FIG. 3.

Figure 4:
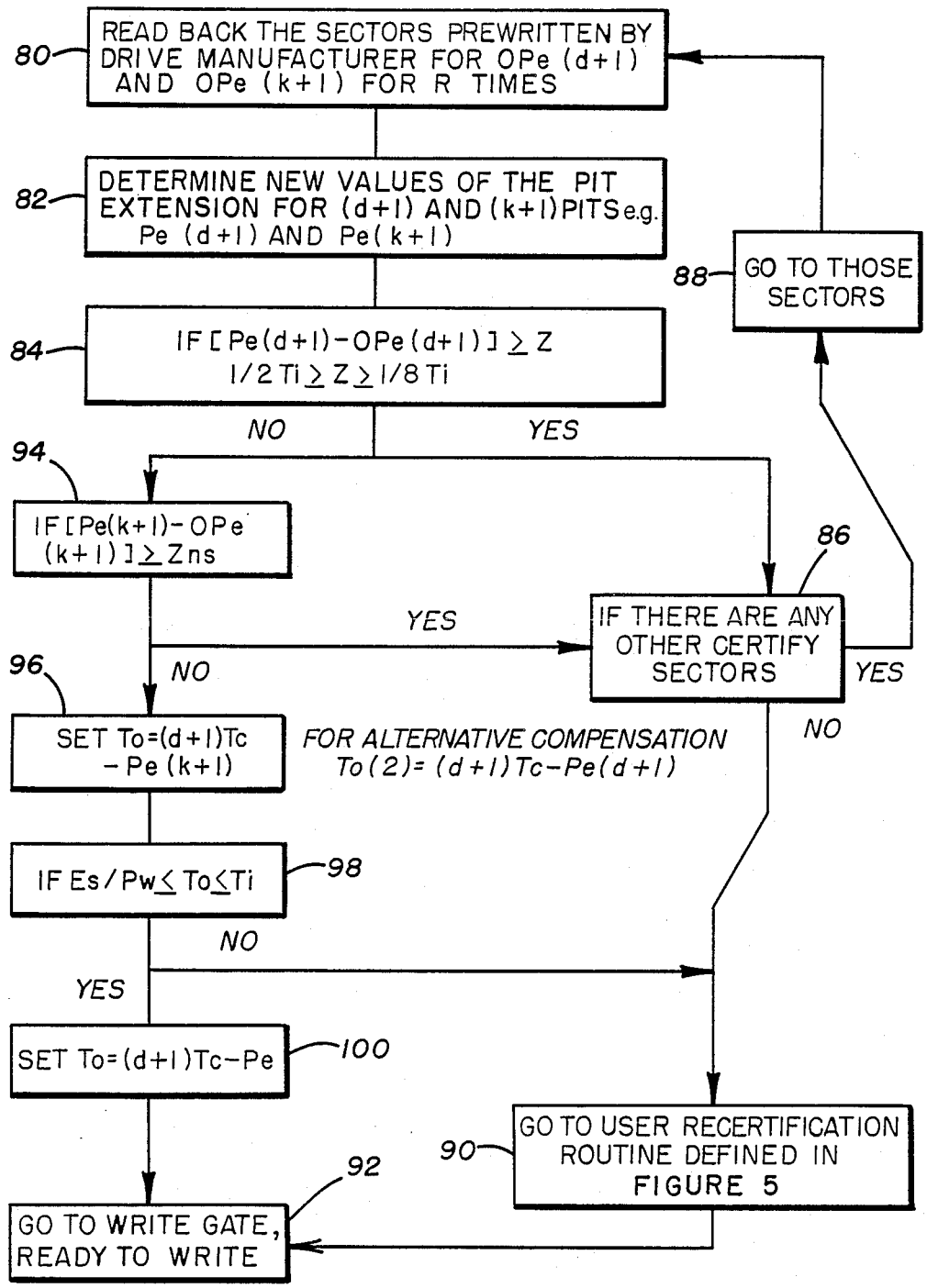
FIG. 4 is a flow chart showing the preferred initialization steps to be undertaken in preparation for data write operations on an optical medium according to the present invention.
Figure 5:
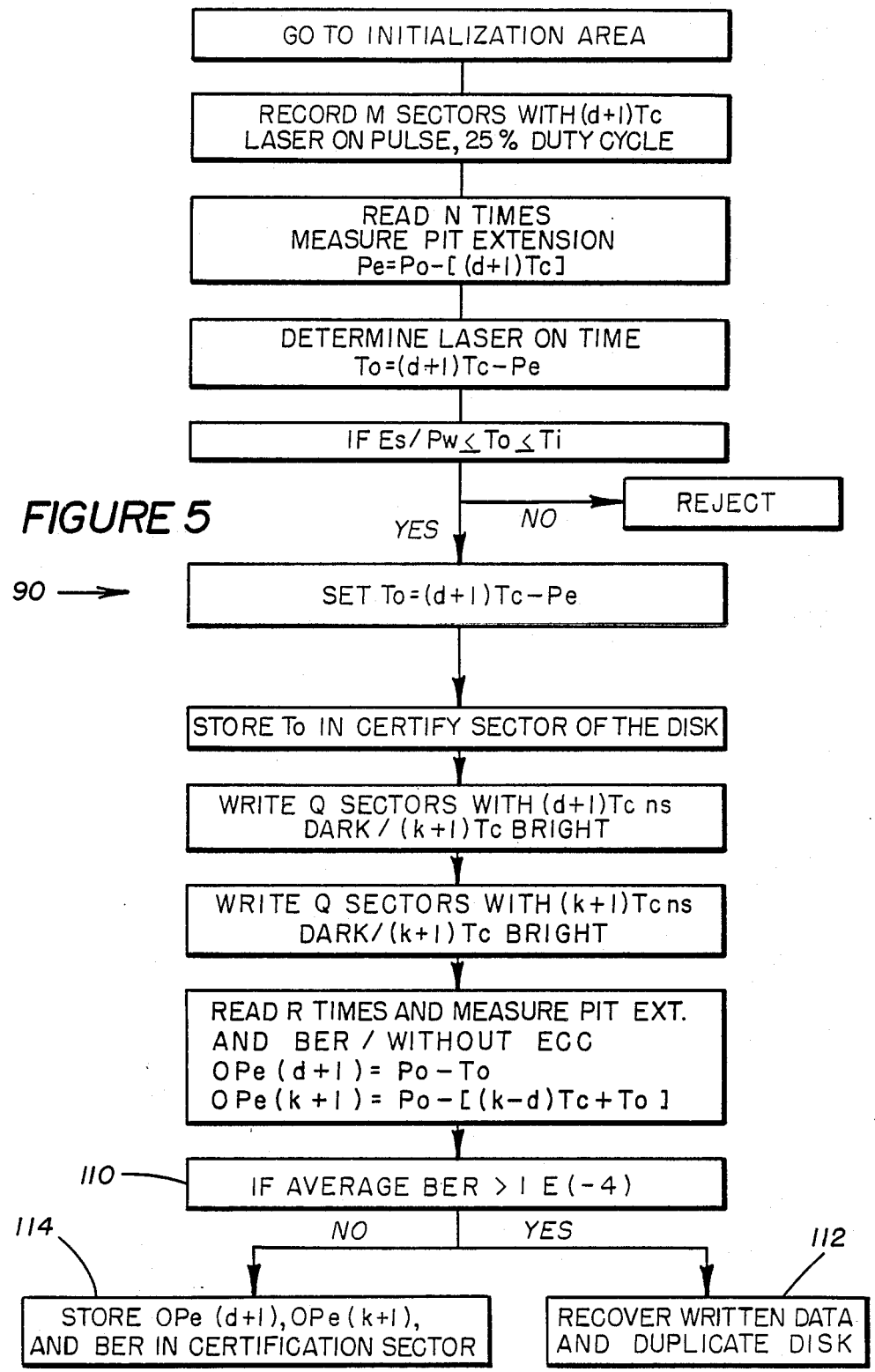
FIG. 5 is a flow chart showing the preferred steps to be undertaken in optical medium recertification for determining pit extension in preparation for data write operations on the medium according to the present invention.
Figure 6:
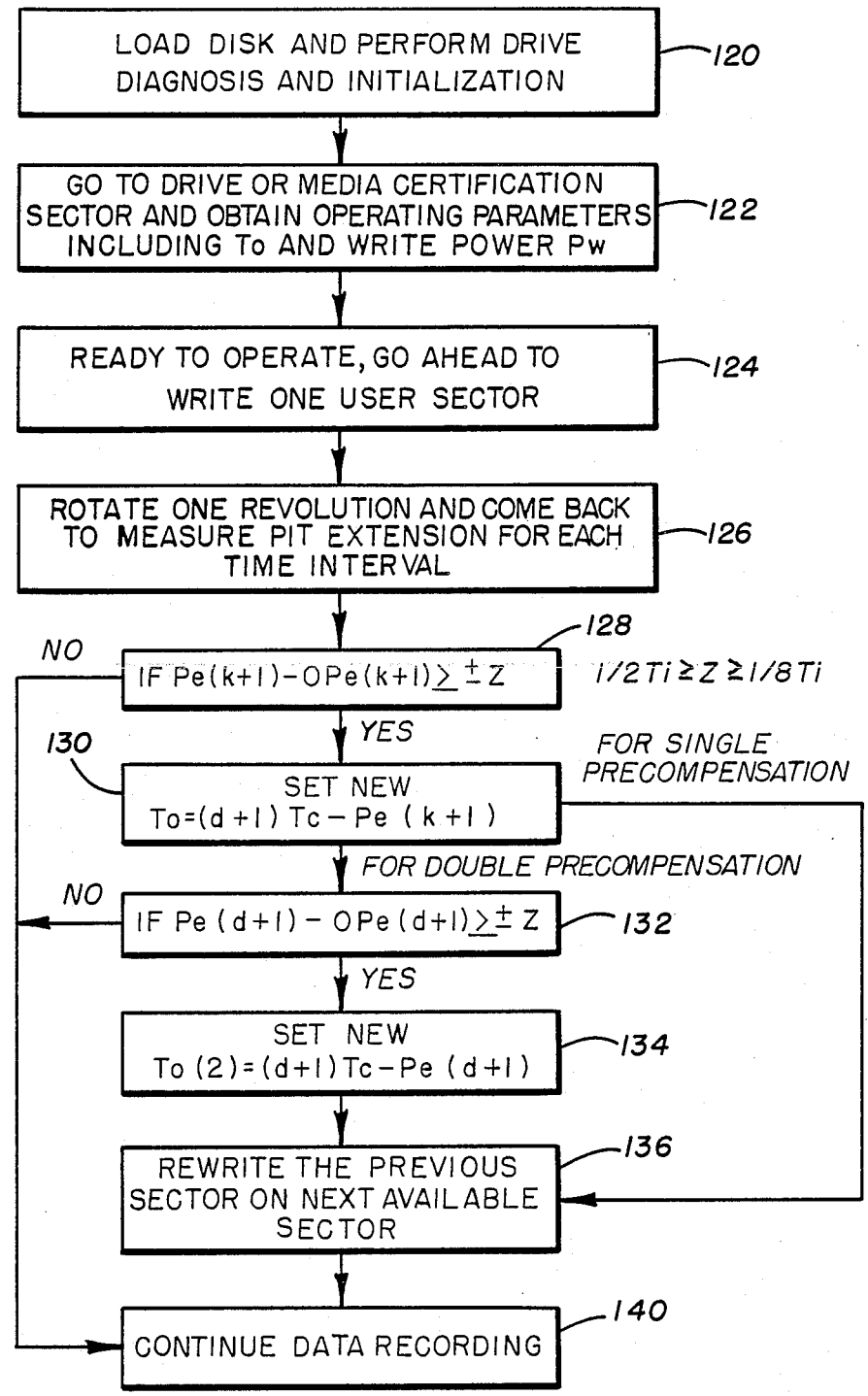
FIG. 6 is a flow chart showing a second write initialization routine according to the present invention.

A user of a medium whose pit extension and optimum laser on time To have been calculated, may choose to recertify the quality of the medium just prior to its use in a data writing procedure, as an additional safeguard against errors. The preferred user recertification procedure according to the present invention is shown in FIGS. 4-6. Theoretically, the pit extension measured by the user pursuant to this procedure using the smallest pits written by the drive or media manufacturers will never be more than 20% different from the original pit extension value. Therefore, this user recertification routine will most likely bea read-only process.

The procedure begins, as shown at Step 80, with the read back of a selected number of sectors containing the minimum original pit extension values $[OPe(d+1)j$ and maximum original pit extension values $[OPe(k+1)j$ that were stored by the manufacturer as shown in FIG. 3. These pits are measured up to R tiess each. In Step 82, the certification test pits are read back and the pit extension calculated. For pits of minimum permitted duration, the $(d+1)Tc$ pits of Step 64, a pit extension value of $Pe(d+1)$ is obtained, and for pits of maximum permitted duration, the $(k+1)Tc$ pits of Step 66, a pit extension value of $Pe(k+1)$ is obtained.

In Step 84, the newly calculated pit extension value for pits of minimum duration $\{Pe(d+1)j$ is compared to the corresponding original pit extension value $[OPe(d+1)j$ as read back in Step 80. The two pit extension values are then compared with a specified time Z defined, for example, to be greater than or equal to $Ti/8$ and less than $Ti/2$. If the difference between the two values is greater than this specified time, e.g., 60 ns, the routine determines if any other certification sectors exist (Step 86). If so, that band of sectors is accessed in Step 88 and $Pe(d+1)$ and $Pe(k+1)$ redetermined. If no further certification sectors exist, the medium manufacturer certification procedure of FIG. 3 is repeated, as shown in Step 90 in FIG. 5. As mentioned above, the probability that it will be necessary to repeat the latter procedure is very low. When certification is completed, the medium is ready for storage of data, as shown at Step 92.

If the test described above in Step 84 is passed, a comparison is then made in Step 94 between the newly calculated pit extension [Pe(k+1)j and the original pit extension [OPe(k+1)j for pits of maximum permitted duration. If the difference between those values is greater than the same specified time, the routine again proceeds to Step 86, as described above.

If the difference determined in Step 90 between the newly calculated pit extension and the original pit extension for pits of maximum permitted duration is not greater than Z, the compensated laser pulse on-time (To) is calculated in Step 96 according to the equation $To=(d+1)Tc-Pe(k+1)$. A second value of To could also be calculated (To2) to provide an alternative or second compensation value for the system, using the equation $To2=(d+1)Tc-Pe(d+1)$. The calculated value To2 represents the duration of laser pulse on time required to produce a pit of the minimum permitted duration including pit extension. The pit extension for pits of maximum permitted duration [Pe(k+1)j is preferably used in the compensation equation of Step 96 so that compensation can be made for the largest error caused by pit extension.

In Step 98, the compensated laser pulse on-time (To) of Step 96 is compared to the ratio of saturation energy to recommended write power (Es/Pw) for the laser to be used. If To is not greater than or equal to Es/Pw and is not less than the window time (Ti), the routine again requires that the medium be recertified as defined in the routine shown in FIG. 5. If To is greater than or equal to Es/Pw and less than the window time (Ti), the compensated laser on time (To) is set in Step 100 according to the equation $To=(d+1)Tc-Pe$. On completion of this Step, the medium is ready to store data, as seen at 92.

As mentioned above, FIG. 5 illustrates the user recertification routine shown at Step 90 in FIG. 4. As seen in FIG. 5, the user recertification routine is essentially identical to the certification routine described above and shown in FIG. 3, as used by the original drive or media manufacturer. The only difference is that, as seen at Step 110, a less strict standard of rejection may be desirable at this point in terms of the detected bit error rate from the medium. This is a function of the error correction capability of the particular data recording and read back system being used. That is, in this routine, if the bit error rate exceeds 1 E(−4), the disk is not utilized for further data recording. As seen in Step 112, in such a case the data on the disk medium is rewritten onto a second medium and the original disk then destroyed. Conversely, if the bit error rate is less than 1 E(1−4), the newly calculated original pit extension values OPe(d+1) and OPe(k+1) for the smallest and largest pits and the newly calculated bit error rate are stored in one or more new certification sectors, as shown in Step 114.

FIG. 6 illustrates an alternative routine for user initialization of a medium preliminary to data recording. As seen in FIG. 6, after a disk on which data is to be recorded is loaded in the disk drive and preliminary drive diagnosis and initialization has been completed, as shown in Step 120, the preliminary parameters Tc, Ti, d, k, Pw, Es are obtained from the medium certification sectors (at Step 122). Then, as seen in Step 124, a first user sector of data is written to the medium. If acceptable data is successfully recorded at this point, this avoids the need to tie up one or more additional certification sectors on the medium for the purpose of testing the current quality of the medium and the drive. Testing of this first data sector is performed, beginning in Step 126, by coming back to the sector just written and measuring the average pit extensions for each of the pit timings written in this first user sector. The routine then proceeds with testing the new pit extension values with the original pit extension values stored in the certification sector with a specified time Z, at Steps 128 and 132, as described above in FIG. 4, and in either case, if the difference between the two values is equal to or greater than plus or minus Z nanoseconds, the laser on time To is set to the time (d+1)Tc less the new pit extension obtained (Steps 130 and 134). If just To is modified, i.e., in a single precompensation case, or if both To and To2 are modified, i.e., in the double precompensation case, the sector previously written is rewritten again on the next available sector in Step 136 using the new values To (and To2 if also available). If the test of Steps 128 and 132 do not show a pit extension difference greater than or equal to Z nanoseconds, then recording is continued of the next available sector, as shown at Step 140.

By providing means for detecting pit edge extension, the present invention enables the use of a laser pulse modulation code that provides recording of code bits as pits on an optical medium such that pit edge extension is uniform among pits regardless of pit length and such that the code bits can be accurately and reliably read by detection of the leading and trailing edges of the recorded pits. A representative example of such a pulse modulation code enabled by the present invention may be described as follows, with reference to FIGS. 7–16.

A variety of standard processes for encoding data for storage in optical media are known in the art. Generally, encoding schemes convert a stream of data signals into code signals comprising a series of binary code bits that may be transmitted or stored. In optical medium systems, the code bits may be converted into pulses of laser light energy that burn pits into the recording surface of the optical medium.

In some coding schemes, binary code 1's represent a change of voltage state and binary code zeros represent the absence of change in a voltage state. In other coding schemes, binary code 1's represent a transition state of one polarity while binary code zeros represent a transition state of the opposite polarity. FIG. 7A shows the relationship of on-time (To) and off-time (Tf) for pulses having a window time (Ti) as defined by the equation $Ti=To+Tf$. Also shown in FIG. 7A is the pit extension (Pe) produced in an optical storage system in which laser pulses burn pits in the recording surface of an optical medium. Pit extension is the thermal alteration of the medium which continues after cessation of the laser pulse. Pit extension is undesirable because it causes signal noise and errors, called pit jitter, when encoded data are read from the medium.

FIG. 8 illustrated the timing of an exemplary optical edge modulation (OEM) code usable ln an optical disk recording system according to the present invention. As described herein, the OEM code enables the recording of regions of altered reflectivity in an optical medium having controlled edges. The OEM code is implemented using a state machine, also referred to as code conversion means. In a state machine, the next state is determined by the present state and the present input conditions. The basic state diagram for the OEM code is shown in FIG. 9. As is seen, the OEM code has five different states, indicated as I–V. These code word states are shown in the boxes in FIG. 9. As seen in each box, each code word comprises three code bits. The numbers on the lines connecting the code word state boxes represent the polarity of the next data bit received once the state machine is in a given state.

In operation, with the state machine in one state, the code bits at that state are output. When the next data bit is received, the state machine goes to the next indicated state as a function of the polarity of that next data bit. The code bits at the indicated next code word state are then output. This process continues indefinitely, and each of the five code word states are reached periodically as a function of the serially occurring binary data bit states input to the state machine.

The OEM state machine further includes a starting location, i.e., a means responsive to a first data bit for accessing a predetermined one of said five code word states. According to the present invention, means are provided for determining when a first data bit state is coupled to the state machine. If the first data bit detected is at a first polarity, code word state I is accessed, whereas if said first data bit is in an opposite second polarity state, code word state V is accessed. As described above, when either of said first or fifth code word state is accessed, three code bits defined in each state are generated in response thereto.

Complete operation of the state machine is therefore illustrated in FIG. 9. As is seen, with the state machine at code word state I, if a data bit of a binary "1" polarity is received, the state machine reaccesses the first code word state and regenerates again the series of code bits indicated at code word state I. If a binary "0" polarity data bit is received, the state machine is caused to access code word state II and the code words therein are output. The operation of the rest of the state machine shown in FIG. 9 occurs in the same manner as described above.

It should be noted that the state machine shown in FIG. 9 is shown in NRZ format rather than in RZ format. To illustrate the distinctions between these two formats, FIG. 10 illustrates examples of signals in the non-return to zero (NRZ) format as compared with signals in the return to zero (RZ) format. As can be seen, in an NRZ format, each "1" bit illustrates a state transition from a first polarity to a second polarity and a "0" bit illustrates the absence of such a transition. In the RZ format, each "1" bit indicates a pulse and each "0" bit indicates the absence of a pulse. This distinction is very important in optical memory applications, since in magnetic recording systems, the recording medium is symmetrical, i.e., flux reversals are recorded on the media, so that it does not matter which polarity you are in at a given time. In optical recording systems, however, the recording medium is not symmetrical, in that the recording of a pit using a laser is not symmetrical with the absence of such a pit on the surface of the medium.

Any code developed should have relationships of pit sizes that can be specified in terms of small integers. This is required because the read back signal is clocked against a clock that is derived from the code itself, and large integers imply complex timing circuitry.

Figure 7B:
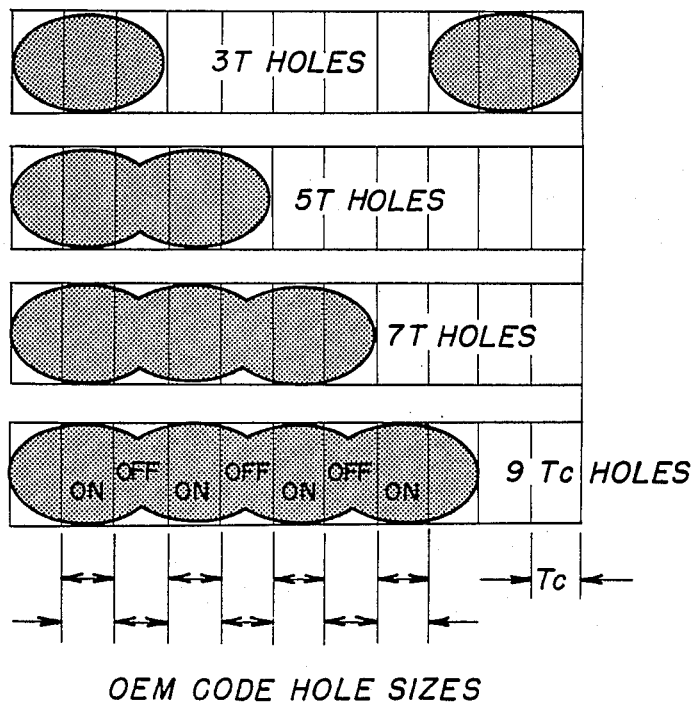
FIG. 7B is a timing diagram of laser on times and the resultant four pit sizes formed thereby according to the present invention for encoding code bits generated by an exemplary optical edge modulation code.

The OEM code timing is specified by the above process and a nominal on time equal to one half of a beam diameter, and one third of a minimum pit diameter, as seen in FIG. 1. The other pit sizes are therefore determined by a nominal off time equal to the on time. The result is four hole sizes that have the durations of 3, 5, 7, and 9 laser on times. The time between pits also has durations of 3, 5, 7, and 9 laser on times. The nominal on time and off time are equal to the code bit times. These pit sizes are shown in FIG. 7B. According to the present invention, the actual on and off times may be changed from this nominal time by a one shot to compensate for variations in the pit extension sensitivity of a given medium. A sync mark is specified by a laser off time of 11 code bit times, separated of course by laser on times of any legal duration.

Figure 11:
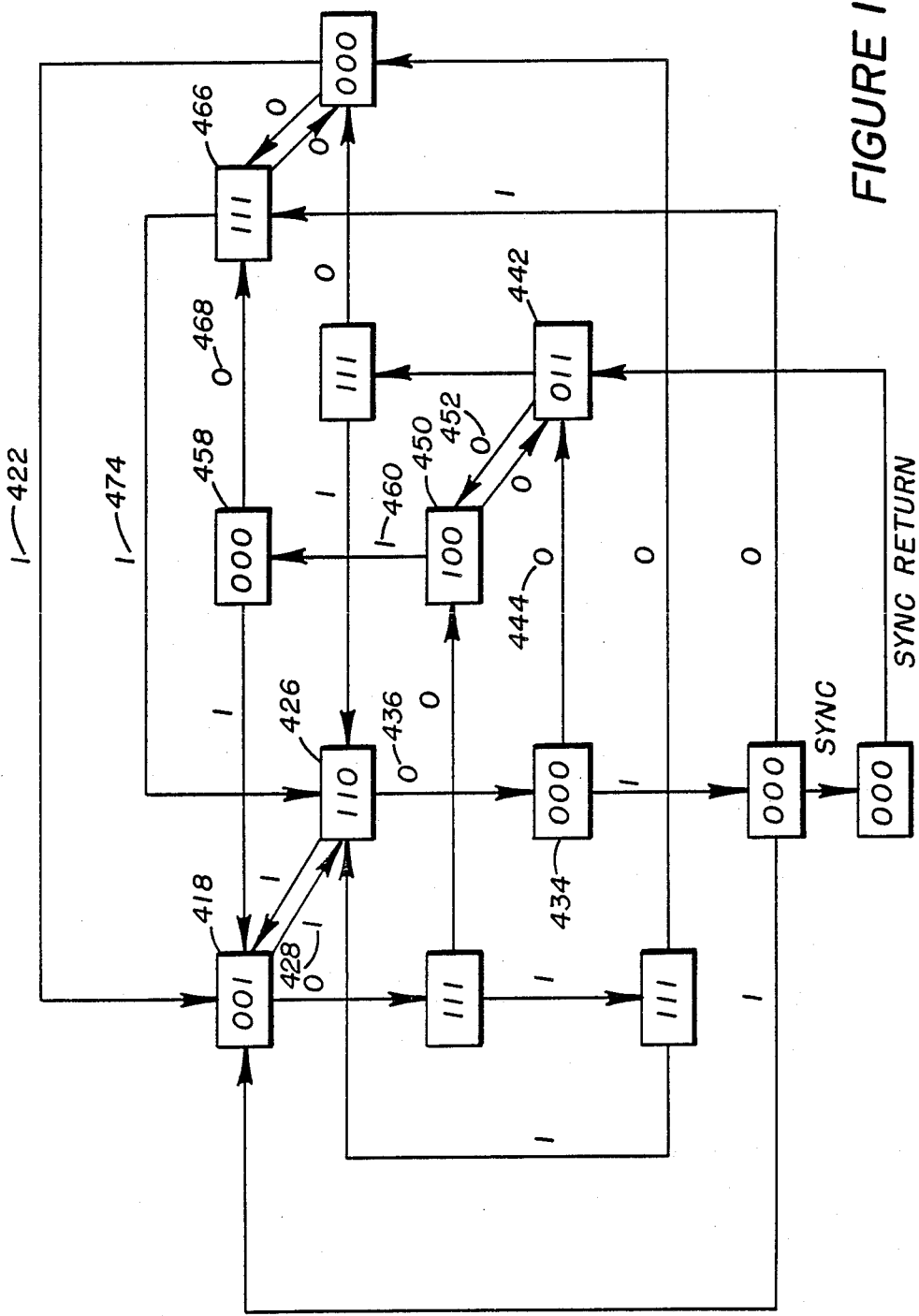
FIG. 11 is a polarized read state diagram showing the relationship of recorded code bits to the decoded data output bits according to a preferred embodiment of the OEM decoding means according to the present invention.

FIG. 11 is a polarized read state diagram which can be used to derive the write state machine and the read state machine look up table. This state diagram is a polarized version of the OEM code state diagram shown in FIG. 9 because, as described above, in optical write once systems, the medium starts off in an unwritten state and changes to a written state after being exposed to laser light energy of sufficient magnitude. In the usual case where the optical media is ablative, the medium is initially free of pits on the surface of the media, except for whatever defects may exist on the surface, and, after writing of data onto the medium, pits exist at selected locations and represent coded data. Since this not a symmetrical medium, it is important to keep track of the present state of the optical medium during the recording process. An alternative way to polarizing the state diagram shown in FIG. 11 would be to simply couple the code bit output by the OEM code state diagram of FIG. 9 through a flip-flop whose output is fed to the medium. It has also been found that the polarized state diagram provides the code bits which are most easily usable, as described below, with regard to the polar write state diagram of FIG. 12 for generation of pits of desired size on a medium according to the present invention. As in FIG. 9, the state diagram of FIG. 11 includes a plurality code word states wherein code bits are generated at each code word state indicated by the boxes in FIG. 11. Also as in FIG. 9, transitions from one code word state to another depend on the state of the next data bit input to the read state machine.

Figure 12:
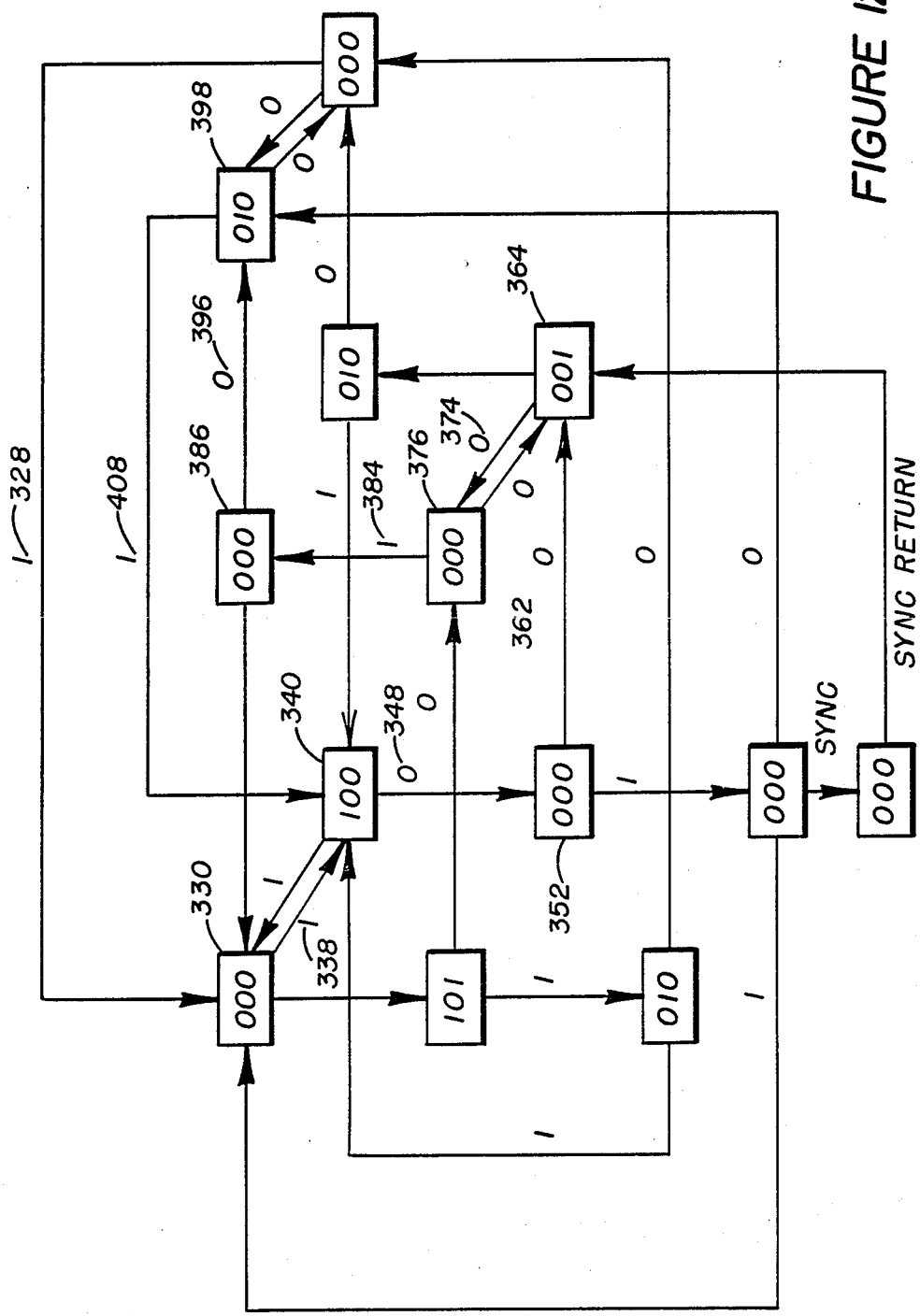
FIG. 12 is a polarized write state diagram showing the relationship of input data bits to recorded code bits according to a preferred embodiment of the OEM encoding means according to the present invention.

FIG. 12 illustrates a polarized write state diagram showing the relationship of input data bits to recorded code bits according to a preferred embodiment of the OEM encoding means according to the present invention. This state diagram is preferably derived from the above described polarized read state diagram of FIG. 11 simply by deleting every other code "1" polarity bit encountered in each string of 1's shown in the state diagram of FIG. 11. This results in a state diagram which is usable for obtaining the encoding code bits for the write state machine shown in FIG. 12. Most importantly, it can be seen that this enables the writing of long pits on a recording medium. That is, where the laser on time is equal to, one-third of the length of the region of altered reflectivity formed by a pulse of laser light energy, alternating laser pulses enable the writing of pits of any desired length on the medium without generating excess thermal accumulation of energy on the medium.

Figure 13:
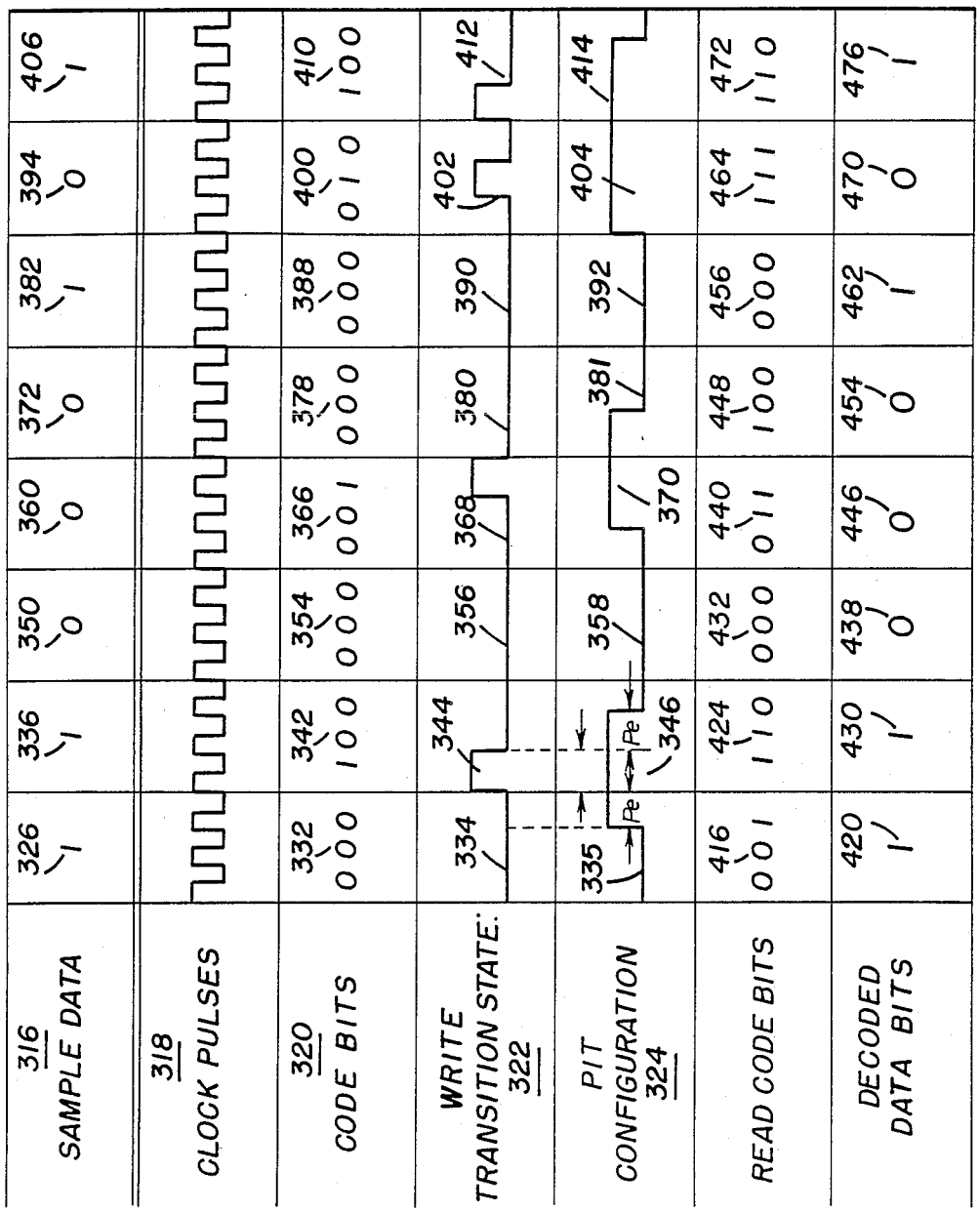
FIG. 13 is a timing diagram illustrating an exemplary series. of data bits, the operation of encoding means to convert said data bits into code bits according to the stage diagram shown in FIG. 12, the resultant pitting formed in an exemplary optical medium, the operation of decoding means according to the state diagram of FIG. 11 to thereafter read back the coded data from said medium, and for generating output binary data bits corresponding to the input binary data bits.

The state diagrams of FIGS. 11 and 12 are best explained in relation to FIG. 13 which shows an arbitrarily chosen example of a sequence of data bits 316 sought to be encoded. FIG. 13 shows how an exemplary series of data bits 316 is converted, using clock pulses 318, into code bits 320. As will also be seen, code bits 320 are converted into write transition states 322 which are used to control the laser beam on-time. The resulting pit configuration in the surface of an optical medium is show at 324.

The first sample data bit in FIG. 13 to be encoded, indicated at 326, is a binary "1". In the state diagram of FIG. 12 it is shown at a starting location 328. The associated arrowed line shows that the first three code bits are "000" as shown in FIG. 12 at 330 and in FIG. 13 at 332. In the preferred embodiment of the present invention, the binary code "1" represents a transition state of one polarity causing a laser on-pulse and a binary code "0" represents a transition state of the opposite polarity which causes a laser off-time. Because first sample data bit 326 was encoded at 332 into three binary "0"s, the write transition state 334 that results is that of no change in transition state from the original polarity. Therefore, during the encoding of first sample data bit 326, the laser is off and no pitting of the recording surface of the optical medium occurs.

The second sample data bit 336 is another binary "1", shown in the state diagram of FIG. 12 at 338, which is encoded into code bits "100" at 340 in FIG. 12 and as shown in FIG. 13 at 342. The binary code 342 results in the write transition state 344 indicating a change in state to one polarity for the binary "1" followed by a change of state to the opposite polarity for the first binary "0" and a continuation of the latter polarity state for the last binary "0" of the code. Therefore, the laser is turned on for the transition state of the binary "1" and off for the transition state of the binary "0". The configuration of the resulting pit on the recording surface of the optical medium is shown in FIG. 13 at 346. As indicated, the transition state 344 results in a pit Po whose leading and trailing edges are extended beyond Po by an amount of pit extension Pe which is a function of the thermal characteristics of the particular optical medium being used. Transition state 344 and pit configuration 346 have the relationship shown in FIG. 7A, described above.

The third sample data bit is a binary "0" shown at 348 in FIG. 12 and at 350 in FIG. 13, which is encoded into code bits "000" at 352 in FIG. 12 and at 354 in FIG. 13. The code 354 results in the transition state 356 which is a continuation of the transition state of the preceding code because the latter code ended in a binary "0". The transition state 356 produces laser off-time and therefore no pitting as shown by pit configuration 358.

The next sample data bit 360 is another binary "0", shown in the state diagram of FIG. 12 at 362, which is encoded into the code bits "001" as shown at 364 in FIG. 12 and at 366 in FIG. 13. Binary code 366 results in the transition state 368 which indicates a continuation of the preceding state because code 366 begins with the same code bit that ended code 354. The last code bit of code 366 is a binary "1" and thus causes a change in transition state polarity, with the result that a laser pulse is generated. This pulse pits the recording surface of the optical medium with a pit of configuration 370. The pit includes an amount of pit extension at its leading and trailing edges as shown in FIG. 7A and as discussed above in relation to pit 346.

The next sequential sample data bit 372 is a binary "0", shown in the state diagram of FIG. 12 at 374, which is encoded into the code bits "000" as shown at 376 in FIG. 12 and at 378 in FIG. 13. The code 378 results in the transition state 380 which is a change of polarity state from the end of the preceding state which was set by a binary code bit "1". Transition state 380 produces laser off-time and therefore no pitting of the optical medium.

The next sample data bit 382 is a binary "1", shown in the state diagram of FIG. 12 at 384, which is encoded into the code bit "000" as shown at 386 in FIG. 12 and at 388 in FIG. 13. Binary code 388 results in the transition state 390 which is a continuation of the transition state of the preceding code because the latter ended with a binary code "0". The transition state 390 produces laser off-time and therefore no pitting of the optical medium as shown by pit configuration 392.

The next sample data bit 394 is a binary "0", shown in the state diagram of FIG. 12 at 396, which is encoded into the data bits "010" as shown at 398 in FIG. 12 and at 400 in FIG. 13. The binary code at 400 results in the transition state 402 which begins as a continuation of the polarity of the preceding transition state 390, changes polarity in response to the binary code bit "1" of the code at 400, then changes polarity again in response to the code bit "0" of the code at 400. A laser pulse is generated by the code pattern at 400 and pits the recording surface of the optical medium to produce pit configuration 404. The pit includes an amount of pit extension Pe at its leading and trailing edges as discussed above and as shown in FIG. 7A.

The last sample data bit 406 is a binary "1", shown in the state diagram of FIG. 12 at 408, which is encoded into code bits "100" as shown in FIG. 12 at 340 and at 410 in FIG. 13. The code at 410 results in the transition state 412 which changes from the polarity state of preceding transition state 402 in response to the binary "1" of the code at 410, then changes the polarity state again in response to the binary code "0" of the code at 410. A laser pulse is generated by the code pattern 410 and a pit of configuration 414 is formed in the recording surface of the optical medium. In this case, the adjacent pit extensions Pe of the pits 404 and 414 overlap. This pit therefore is formed as shown for the 5 T length pit illustrated in FIG. 7B.

By following the logic of the state diagram of FIG. 12, the code bits resulting from the encoding of any sequence of data bit according to the present invention can be determined.

The operation of the code of the present invention in the data retrieval or read mode can be described by reference to the diagram of FIG. 13 and the read state diagram of FIG. 11. In the preferred embodiment of the present invention, a pit, shown in the pit configuration 324 as an elevated segment of the line, represents a binary code "1", while a non-pitted area represents a binary code "0". For explanation of the read mode, the arbitrary pit configuration 324 will be used as a representative example for illustrating the decoding process according to the invention.

The first portion 335 of pit configuration 324 that is read shows two non-pitted segments, representing two binary code "0"s, followed by one pitted segment representing one binary code "1". Thus, the pit configuration represents code bits "001" shown at 416 in FIG. 13 and at 418 in the read state diagram of FIG. 11. The data bit corresponding to code 416 is a binary data bit "1" shown at 420 in FIG. 13 and at 422 in the state diagram of FIG. 11.

The next portion 346 of pit configuration 324 comprises two pitted segments followed by one non-pitted segment. This represents code bits "110" as shown at 424 in FIG. 13 and at 426 in the state diagram of FIG. 11. The state diagram also shows that between code 418 and 426 the binary data bit "1" is found, as shown at 428 in FIG. 11. Thus, the decoded data bit 430 in FIG. 13 is a binary "1".

Next, portion 358 of pit configuration 324 is read as three non-pitted segments representing code bits "000". These bits are shown at 432 in FIG. 13 and at 434 in FIG. 11. The state diagram of FIG. 11 shows, at 436, the data bit "0" between code bits 426 and code bits 434. Thus, the decoded data bit "0" is shown at 438 in FIG. 13.

The next portion 370 of pit configuration 324 is read as a non-pitted segment followed by two pitted segments and therefore represents code bit "011" shown at 440 in FIG. 13 and 442 in FIG. 11. The state diagram of FIG. 11 shows, at 444, the data bit "0" between code bits 434 and code bits 442. This decoded data bit "0" is shown in FIG. 13 at 446.

Portion 381 of pit configuration 324 is read as a pitted segment followed by two non-pitted segments and therefore represents code bits "100" shown at 448 in FIG. 13 and at 450 in FIG. 11. The read state diagram of FIG. 11 shows, at 452, the data bit "0" between code bits 442 and code bits 450. The decoded data bit "0" is shown at 454 in FIG. 13.

The next portion 392 of pit configuration 324 is read as three non-pitted segments and represents code bits "000" shown at 456 in FIG. 13 and at 458 in FIG. 11. The state diagram of FIG. 11 shows, at 460, the data bit "1" between code bits 450 and code bits 458. The decoded data bit "1" is shown in FIG. 13 at 462.

Portion 404 of pit configuration 324 is read as three pitted segments and therefore represents code bits "111" shown in FIG. 13 at 464 and in FIG. 11 at 466. The decoded data bit "0" is shown in FIG. 11 at 468 and FIG. 13 at 470.

The last portion of the pit configuration 324 to be read, shown at 414 in FIG. 13, indicates two pitted segments followed by one non-pitted segment, thereby representing code bits "110" shown in FIG. 13 at 472 and in FIG. 11 at 426. The state diagram of FIG. 11 shows, at 474, the data bit "1" between code bits 466 and 426. The decoded data bit "1" is entered into FIG. 13 at 476. Thus, the decoding process correctly decodes the pit configuration 324 back into data bits corresponding to the original sample data 16.

Figure 14:
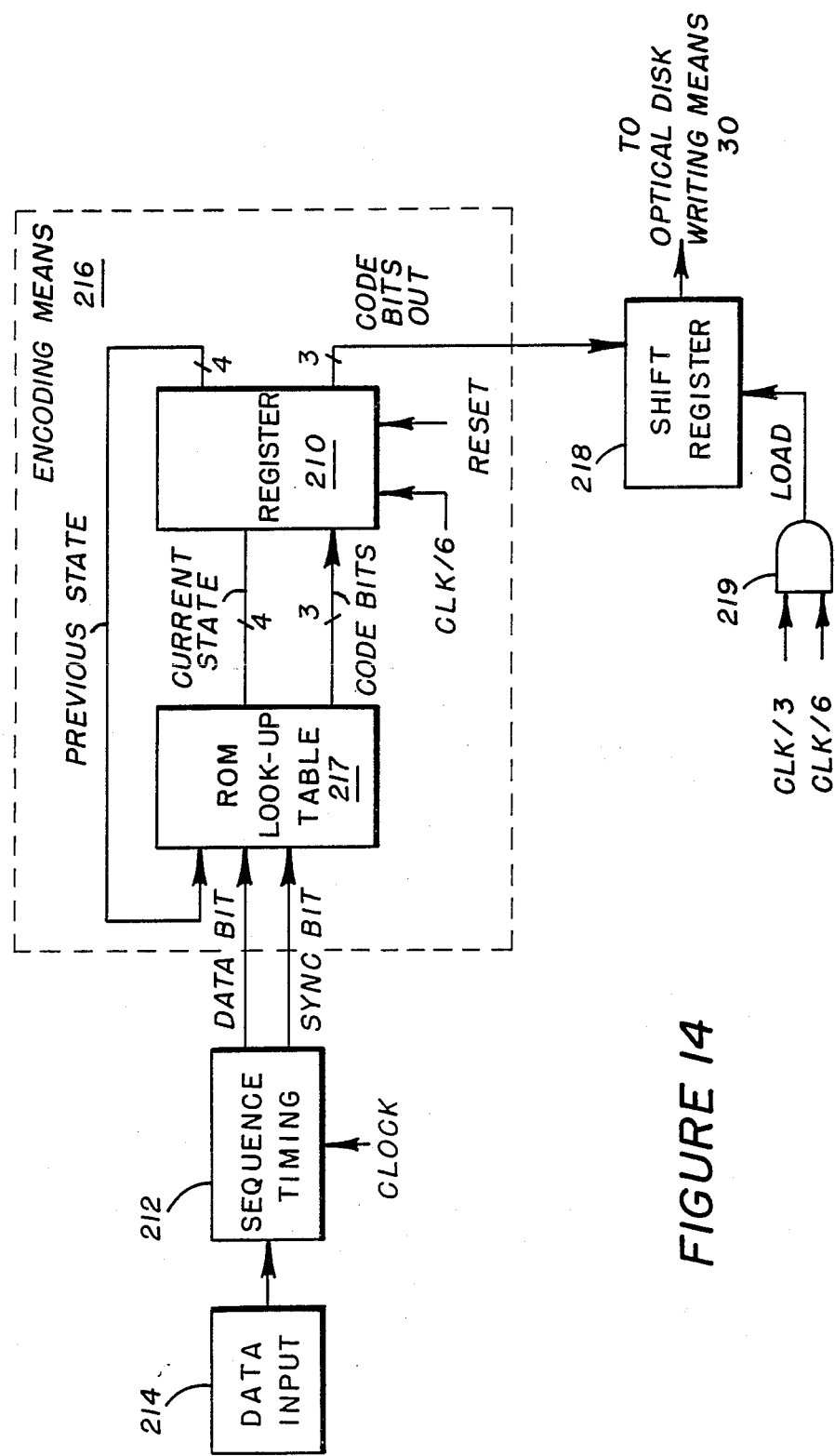
FIG. 14 is a block diagram showing the preferred embodiment of encoding means according to the present invention.
Figure 15:
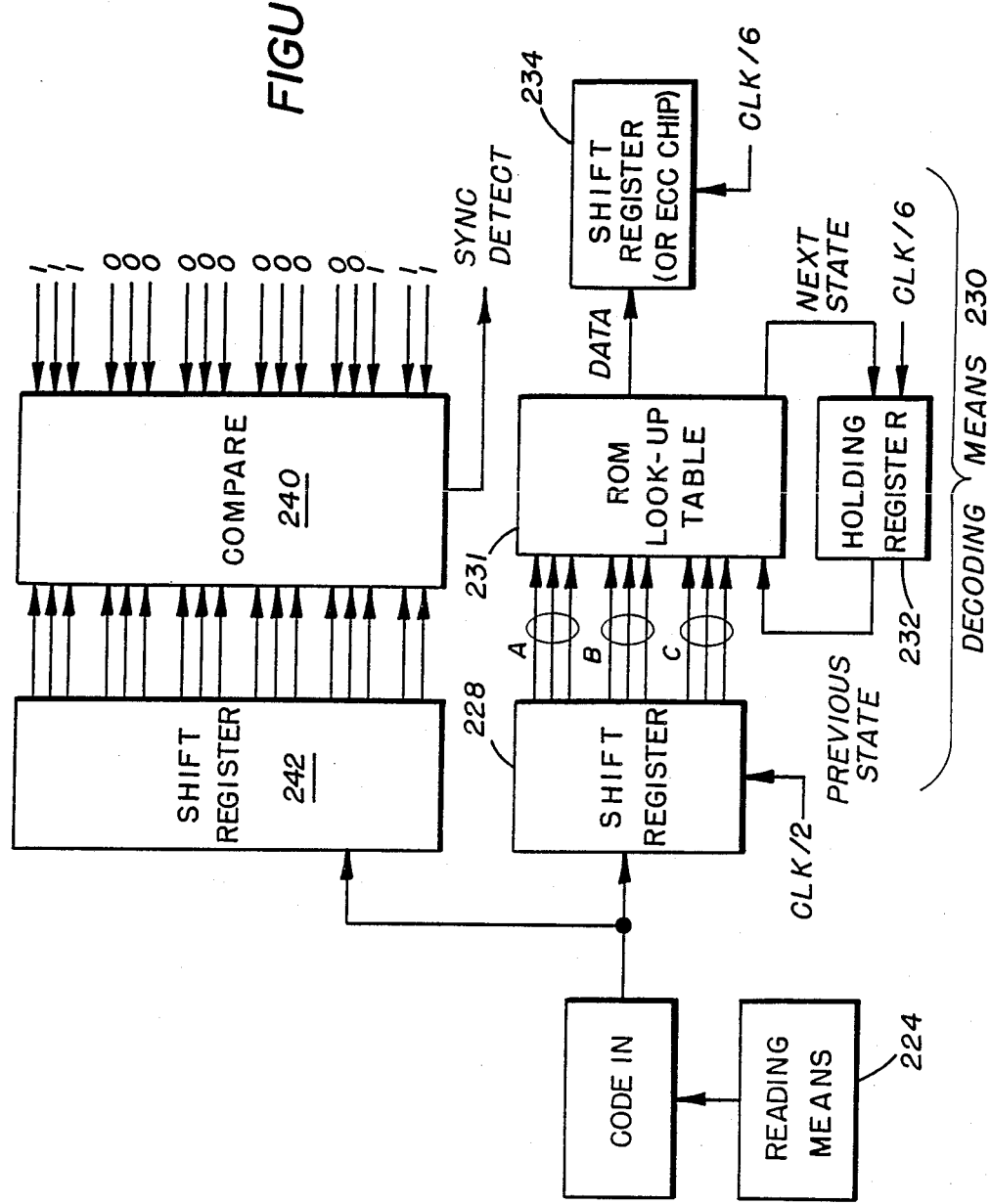
FIG. 15 is a block diagram showing the preferred embodiment of decoding means according to the present invention.

A more detailed block diagram of the encoding means according to the present invention is shown in FIG. 14. A more detailed block diagram of the decoding means according to the present invention is shown in FIG. 15. Both of these modes are driven by the clocking circuit shown in FIG. 16.

Figure 16:
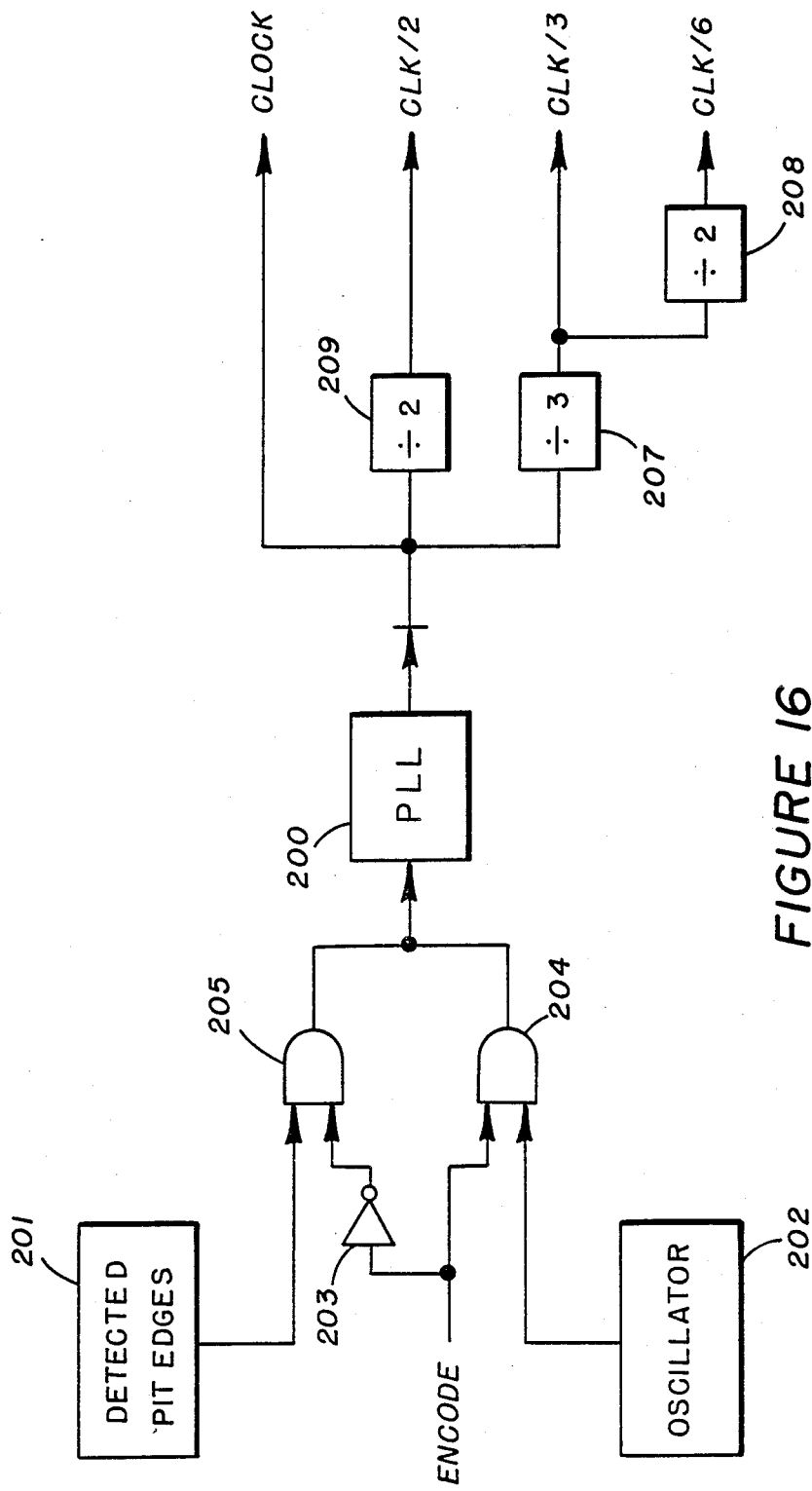
FIG. 16 is a block diagram of a means for generating system clocking according to the present invention.

Referring first to FIG. 16, the clocking circuit is driven by either the pit edges detected on the surface of a medium during a read mode, shown at 201, or a conventional crystal oscillator 202 used during the encoding mode. These two sources of clocking pulses are fed to a phase lock loop (PLL) 200 via a conventional switch such as via AND gates 204 and 205 and invert gate 203. As seen in FIG. 11, the polarity of the encode command signal, when high, enables oscillator 202 to be coupled to the phase lock loop 200. When the encode command signal is low, inverter gate 203 enables AND gate 205 to couple the detected pit edges 201 to the phase lock loop 200 and to disconnect oscillator 202.

As will be seen, various clock pulses are required in the encoding mode and decoding mode according to the present invention. Consequently, a conventional divide-by-two 209 is used to generate a clock pulse CLK/2 whose frequency is one-half that of the clock pulse. A divide-by-three 207 enables the generation of a clock pulse of one-third the frequency of the clock pulse CLK/3 and a further divide-by-two at 208 output takes the output of the divide-by-three and generates a divide-by-six which is one-sixth as fast as the clock pulse.

Referring now to the encoding means block diagram shown in FIG. 14, data to be encoded is input at 214 to a sequence timing means 212 which functions to tell the encoder when a sync bit is to be generated. The data bit and sync bit output of sequence timer 212 is coupled to encoding means 216 which preferably comprises a read only memory (ROM) 217. This memory 217 is programmed in a conventional manner as a look up table that contains the encoding steps of the write state diagram shown in FIG. 12. This look up table determines the write transition state associated with each given data bit input, as defined by the state diagram. The identity of that state is output from the ROM 217 into a holding register 210. Holding register 210 stores this state identity. When a next data bit is coupled to encoding means 216, the previously entered write transition state identity, as stored in holding register 210, is then clocked from holding register 210 into ROM 217 and is used as a pointer for the memory 217. That is, it enables the encoding means 216 to keep track of where it currently is in the write state diagram.

Encoding means 216 generates three code bits for each data bit according to the write state diagram of FIGS. 9 and 12. As each write transition state is generated by the ROM 217 look up table, the three code bits associated with that particular code word state is also output from ROM 217 and into holding register 210. The code bit output of encoding means 216 is loaded into shift register 218 at a rate three times that of the code word rate under the control of a LOAD pulse. This LOAD pulse is generated by the ANDing of CLK/3 and CLK/6 in an AND gate 219. The clock signal for shift register 218 is the output of divide-by-two circuitry 209 of FIG. 16. Shift register 218 converts the three parallel code bits to a serial code bit output. This serial bit string of output code bits is coupled to the laser for writing onto the optical disk or other storage medium, or for data transmission.

A RESET signal may also be coupled to holding register 210. This signal is generated when power is first applied to the system and ensures that encoding means 216 begins at the proper point in the state diagram. A RESET signal may also be generated whenever a particular writing to the optical disk has been completed so that when a next string of data bits is to be encoded, the encoding means 216 starts at a predetermined start point.

In the decoding mode shown in the block diagram of FIG. 15, the code bits are read from storage means or received from data transmission means via reading means 224. Reading means 224 may also provide the pit edge state transitions 201 (of FIG. 16) necessary to enable phase lock loop 200 to clock the decoding apparatus. The code bits read by reading means 224 are coupled to a shift register 228 which converts the serial stream of code bits into a parallel arrangement of groups of three code bits.

The output of shift register 228 includes three sets, A, B, and C, of three code bits each. One set comprises the three code bits most recently clocked int shift register 228. A second set comprises the three bits next most recently clocked into shift register 228. The third set comprises the three bits clocked into shift register 228 just prior to the second set of code bits. This buffering capability enables the apparatus to accurately and reliably determine the transition state represented by the code bits as shown in FIG. 11. The output of shift register 228 is coupled to a decoding means 230, comprising preferably a conventional ROM memory 231, which performs the transition state look up operations defined by the read state diagram. The identity of the transition state determined for a set of code bits is clocked by CLK/6 into a holding register 232. When a given next set of code bits is coupled to decoding means 230, the identity of the previous transition state, stored in holding register 232, is coupled to ROM 231 and is used as a pointer by ROM 231. Thus, it enables the decoding means 230 to keep track of where it currently is in the read state diagram.

The decoded data bit associated with the transition state determined by decoding means 230 is clocked into either a shift register 234 for serial to parallel conversion or first into error correction code (ECC) means and then into a shift register, thus making decoded data available to the user.

During decoding, a sync pattern is detected by a compare circuit 240. The code bits read by reading means 224 are coupled to a shift register 242 that continuously converts the most recent at least ten of these bits into parallel form for detecting of the string of zero's which defines a sync bit. The actual code bit sequence tested for, in the prefered embodiment, for detecting a sync pattern is 111 000 000 000 001 11X. This sequence includes "1" code bits at each end of a string of eleven "0"s, according to the read state diagram of FIG. 11, in order to differentiate sync patterns from unwritten sections of the optical disk, wherein zero's are also found, by definition.

It is anticipated that optical recording media may be developed wherein, for a given laser beam energy level, the resultant region of altered reflectivity on the medium will be a region whose time duration between its leading and trailing edge transitions is less than the laser on time. In such a situation, the equation $To=(d+1)Tc-Pe$ is still applicable for compensating the laser on time pulse width as a function of this negative pit extension. Of course, in such a case, longer length pits would be formed using continuous laser write pulses rather than the non-continuous laser write pulses described hereinabove, since no pit extension overlapping beyond the laser on time of a given laser beam write pulse would be generated, by definition, with a negative pit extension.

Although the apparatus and method of the present invention have been described and illustrated according to the preferred embodiments and by reference to a representative pulse modulation code, modifications or variations may be made by those skilled in the art within the spirit of the invention. Such modifications or variations are within the scope of the present invention as defined by the appended claims.

What is claimed is:

1. In a system for storing encoded binary data bits in an optical recording medium, including encoding means for converting each of said data bits into a code word comprising one or more code bits, writing means for writing said code bits in the form of a series of pits on said optical recording medium by generating write pulses of laser light energy, and reading means for detecting the edge transitions of pits formed on said optical recording medium, the improvement comprising:

medium certification means for determining the pit extension characteristics of said medium, including means for generating one or more test write pulses each having a predetermined on time, said write pulses causing corresponding pits to be formed on a selected segregated areas of said medium during a first time session before the recording of data, and comparator means for detecting the time durational difference between the on time of said predetermined test write pulses and the duration of the leading edge transition to trailing edge transition of the corresponding pit formed on said medium as read by said reading means; and pit extension compensation means for modifying the duration of each subsequent write pulse written on a selected area of said medium other than said selected segregated area during a second time session, as a function of said durational difference detected by said comparator means.

2. The system of claim 1 wherein said means for generating one or more test write pulses includes means for generating write pulses which cause pits of said selected segregated area of predetermined different lengths to be formed on said selected segregated area of said medium.

3. The system of claim 2 wherein said comparator means includes means for detecting the time durational difference between a pit of a first length and the on time of the corresponding test write pulse used to generate said first length pit and for detecting the time durational difference between a pit of a second length and the on time of the corresponding test write pulse used to generate said second length pit, said pit extension compensation means including means for modifying the duration of each subsequent write pulse used for generating a pit of a first length as a function of said first durational difference and for modifying the duration of each subsequent write pulse used for generating a pit of a second length as a function of said second durational difference.

4. The system of claim 2 wherein said means for generating one or more test write pulses includes means, for each said pit length longer than a minimum length pit, for generating a plurality of adjacent write pulses for forming said given selected pit length, the length of said pit being a function of a number of adjacent write pulses generated, the off time between adjacent write pulses defined to be a predetermined length such that pit extension caused by said write pulses is sufficient to create overlapping pit regions between the portions of said pit formed during the on time of each said write pulse.

5. The system claim 1 wherein said encoding means includes encoding said data bits into code bits such that at least d zero code bits are generated between each adjacent one code bit and wherein the duration of each subsequent write pulse is determined by the following equation:

$$To=(d+1)Tc-Pe$$

wherein To is equal to the on time duration of said write pulse, Tc is the predetermined unit time for each code bit and Pe is said time durational difference detected by said comparator means.

6. The system of claim 1 further including decoding means coupled to said reading means for reconverting said detected edge transitions into said data bits.

7. In a system for storing encoded binary data bits in an optical recording medium, including encoding means for converting each of said data bits into a code word comprising one or more code bits, writing means for writing said code bits in the form of a series of pits on said optical recording medium by generating write pulses of laser light energy, and reading means for detecting the edge transitions of pits formed on said optical recording medium, and wherein said medium includes a certification sector having stored therein the original pit extension value measured for said medium, the improvement comprising:

means for reading said original pit extension value, certification means for determining the current pit extension characteristics of said medium, including means for generating one or more test write pulses each having a predetermined on time, said write pulses causing corresponding pits to be formed on said medium, and comparator means for detecting the current time durational difference between the on time of said predetermined test write pulses and the duration of the leading edge transition to trailing edge transition of the corresponding pit formed on said medium as read by said reading means;

means for comparing said current time durational difference with said original pit extension value; and pit extension compensation means for modifying the duration of each subsequent write pulse as a function of said current durational difference detected by said comparator means when the difference between said current time durational difference and said original pit extension value is less than a predetermined time interval.

8. A method for compensating for pit extension in the storage and read back of data encoded on an optical recording medium, comprising the steps of:

applying at least one test pulse of laser light energy of a preselected duration to a selected segregated area of said optical recording medium during a first time session before the recording of data to form a corresponding test pit thereon;

reading the leading edge to trailing edge duration of said test pit on said selected segregated area of said optical recording medium during said first time session before the recording of data;

measuring the durational difference between the duration of said test pulse of laser light energy and the duration of said test pit; and reducing the duration of subsequent pulses of laser light energy applied to a selected area of said medium other than said selected area during a second time session by an amount equal to said measured durational difference.

9. The method of claim 8 wherein a plurality of test writhe pulses of laser light energy are recorded in one or more of said selected segregated areas on said optical recording medium.

10. The method of claim 8 further including the step of storing said measured durational difference in a certification sector on said optical recording medium.

11. In a system for storing and retrieving data, including an optical recording medium, writing means for writing said data onto the optical recording medium in the form of regions of changed reflectivity of selected length, said regions of changed reflectivity being generated by writhe pulses of laser light energy, and reading means for detecting the leading and trailing edge transitions of each said region of changed reflectivity on said optical recording medium, and improved writing means comprising:

means for writing a region of changed reflectivity longer than a minimum length region on said optical recording medium including means for generating a plurality of adjacent write pulses for said region, the length of said region being a function of the number of adjacent write pulses generated, and for controlling the duration of the on time of each said write pulse and the duration of the off time between adjacent said write pulses such that the on time of said write pulses is sufficient to generate overlapping regions of changed reflectivity between the regions of changed reflectivity corresponding to the on time of each said write pulse.

12. The system of claim 11 further comprising:

means for determining the amount of pit extension generated by a write pulse of predetermined duration; and pit extension compensation means for modifying the on time duration of each said-write pulse as a function of said pit extension.

13. In a system for storing and retrieving binary data bits including an optical recording medium, encoding means for converting each of said data bits into a code word comprising one or more code bits, writing means for writing said code bits in the form of a series of pits on said optical recording medium by generating write pulses of laser light energy and reading means for reading said code bits from said optical recording medium, an improved writing means comprising:

means for determining the pit extension generated on said medium caused by a selected write pulse;

means for forming a pit of a predetermined selected length on said medium as a function of the state of said code bits, including means for generating one write pulse or more than one adjacent write pulses, the number of adjacent write pulses determining the length of a given pit, and for controlling the duration of the on time of each said write pulse and the duration of the off time between adjacent said write pulses such that, for a given pit requiring at least two write pulses for formation thereof, each said off time between adjacent said write pulses is of a predetermined length such that pit extension caused by said write pulses is sufficient to create overlapping pit regions between the portions of said pit formed during the on time of each said write pulse.

14. The system of claim 13 wherein said reading means comprises means for detecting the leading and trailing edge transitions for each pit on said medium and means for converting said detected edge transitions back into said binary data bits.

15. The system of claim 13 wherein said write pulse on time duration is equal to the minimum on time necessary to form a pit on said medium at a given laser light energy level and at a given rate of travel of said medium with respect to said laser less said pit extension.

* * * * *

UNITED STATES PATENT AND TRADEMARK OFFICE
CERTIFICATE OF CORRECTION

PATENT NO. : 4,873,680

DATED : October 10, 1989

INVENTOR(S) : Chi H. Chung, et al.

It is certified that error appears in the above-identified patent and that said Letters Patent is hereby corrected as shown below:

In column 1, line 64, delete "itter" and insert therefor --jitter--.

In column 2, line 11, delete "itter' and insert therefor --jitter--.

In column 3, line 54, after "is" insert --a--.

In column 5, line 68, delete "remanant" and insert therefor --remnant--.

In column 6, line 47, after "maximize" insert --data--.

In column 8, line 30, delete "riding" and insert therefor --recording--.

In column 9, line 43, delete "give" and insert therefor --given--.

In column 10, line 43, delete "codes" and insert therefor --code--.

In column 10, line 64, delete "-j" and insert therefor --]--.

In column 11, line 1, delete "j" and insert therefor --]--.

In column 11, line 12, delete "j" and insert therefor --]--.

In column 11, line 16, delete "j" and insert therefor --]--.

In column 11, line 29, after "(d+1)" delete "-".

In column 11, line 37, delete "pi" and insert therefor --pit--.

In column 12, line 19, delete "greaterr" and insert therefor --greater--.

In column 12, line 40, delete "bea" and insert therefor --be a--.

In column 12, line 43, delete "j" and insert therefor --]--.

UNITED STATES PATENT AND TRADEMARK OFFICE
CERTIFICATE OF CORRECTION

PATENT NO. : 4,873,680
DATED : October 10, 1989
INVENTOR(S) : Chi H. Chung, et al.

It is certified that error appears in the above-identified patent and that said Letters Patent is hereby corrected as shown below:

In column 12, line 44, delete "j" and insert therefor --]--.

In column 12, line 54, delete "j" and insert therefor --]--.

In column 12, line 56, delete "j" and insert therefor --]--.

In column 13, line 5, delete "j" and insert therefor --]--.

In column 13, line 6, delete "j" and insert therefor --]--.

In column 13, line 22, delete "j" and insert therefor --]--.

In column 16, line 25, between "this" and "not" insert --is--.

In column 20, line 66, delete "int" and insert therefor --into--.

In column 22, lines 24 and 25, delete "said selected segregated area of".

In column 22, line 53, after "system" insert --of--.

In column 23, line 56, delete "writhe" and insert therefor --write--.

In column 24, line 2, delete "writhe" and insert therefor --write--.

UNITED STATES PATENT AND TRADEMARK OFFICE
CERTIFICATE OF CORRECTION

PATENT NO. : 4,873,680

DATED : October 10, 1989

INVENTOR(S) : Chi H. Chung, et al

It is certified that error appears in the above-identified patent and that said Letters Patent is hereby corrected as shown below:

In column 24, line 25, delete "said-" and insert therefor --subsequent--.

In the Abstract on line 22, delete "one" and insert therefor --on--.

Signed and Sealed this

Twenty-sixth Day of February, 1991

Attest:

HARRY F. MANBECK, JR.

Attesting Officer

Commissioner of Patents and Trademarks